United States Patent
Kori et al.

(10) Patent No.: US 7,235,486 B2
(45) Date of Patent: Jun. 26, 2007

(54) METHOD FOR FORMING TUNGSTEN MATERIALS DURING VAPOR DEPOSITION PROCESSES

(75) Inventors: Moris Kori, Palo Alto, CA (US); Alfred W. Mak, Union City, CA (US); Jeong Soo Byun, Cupertino, CA (US); Lawrence Chung-Lai Lei, Milpitas, CA (US); Hua Chung, San Jose, CA (US); Ashok Sinha, Palo Alto, CA (US); Ming Xi, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/468,156

(22) Filed: Aug. 29, 2006

(65) Prior Publication Data
US 2006/0292874 A1    Dec. 28, 2006

Related U.S. Application Data

(60) Continuation of application No. 11/338,565, filed on Jan. 24, 2006, now Pat. No. 7,115,494, which is a continuation of application No. 10/951,354, filed on Sep. 29, 2004, now Pat. No. 7,033,922, which is a continuation of application No. 09/625,336, filed on Jul. 25, 2000, now Pat. No. 6,855,368, which is a division of application No. 09/605,593, filed on Jun. 28, 2000, now Pat. No. 6,551,929.

(51) Int. Cl.
*H01L 21/44* (2006.01)
(52) U.S. Cl. .............................. 438/685; 257/E21.155
(58) Field of Classification Search ............... 438/685, 438/654, 656
See application file for complete search history.

(56) References Cited

U.S. PATENT DOCUMENTS 4,058,430 A    11/1977  Suntola et al.

(Continued)

FOREIGN PATENT DOCUMENTS

DE        198 20 147        7/1999

(Continued)

OTHER PUBLICATIONS

Bader, et al. "Integrated Processing Equipment," Solid State Technology, Cowan Pub., vol. 33, No. 5 (May 1, 1990), pp. 149-154.

(Continued)

*Primary Examiner*—David A. Zarneke
(74) *Attorney, Agent, or Firm*—Patterson & Sheridan LLP

(57) ABSTRACT

In one embodiment, a method for forming a tungsten material on a substrate surface is provide which includes positioning a substrate within a deposition chamber, heating the substrate to a deposition temperature, and exposing the substrate sequentially to a first reducing gas and a tungsten precursor gas to form a tungsten nucleation layer on the substrate during an atomic layer deposition (ALD) process. The method may further provide exposing the substrate to a deposition gas comprising a second reducing gas and the tungsten precursor gas to form a tungsten bulk layer on the tungsten nucleation layer during a chemical vapor deposition (CVD) process. Examples include that the ALD and CVD processes are conducted in the same deposition chamber or in different deposition chambers.

39 Claims, 10 Drawing Sheets

U.S. PATENT DOCUMENTS

| | | |
|---|---|---|
| 4,389,973 A | 6/1983 | Suntola et al. |
| 4,413,022 A | 11/1983 | Suntola et al. |
| 4,486,487 A | 12/1984 | Skarp |
| 4,767,494 A | 8/1988 | Kobayashi et al. |
| 4,806,321 A | 2/1989 | Nishizawa et al. |
| 4,813,846 A | 3/1989 | Helms |
| 4,829,022 A | 5/1989 | Kobayashi et al. |
| 4,834,831 A | 5/1989 | Nishizawa et al. |
| 4,838,983 A | 6/1989 | Schumaker et al. |
| 4,838,993 A | 6/1989 | Aoki et al. |
| 4,840,921 A | 6/1989 | Matsumoto |
| 4,845,049 A | 7/1989 | Sunakawa |
| 4,859,625 A | 8/1989 | Matsumoto |
| 4,859,627 A | 8/1989 | Sunakawa |
| 4,861,417 A | 8/1989 | Mochizuki et al. |
| 4,876,218 A | 10/1989 | Pessa et al. |
| 4,917,556 A | 4/1990 | Stark et al. |
| 4,927,670 A | 5/1990 | Erbil |
| 4,931,132 A | 6/1990 | Aspnes et al. |
| 4,951,601 A | 8/1990 | Maydan et al. |
| 4,960,720 A | 10/1990 | Shimbo |
| 4,975,252 A | 12/1990 | Nishizawa et al. |
| 4,993,357 A | 2/1991 | Scholz |
| 5,000,113 A | 3/1991 | Wang et al. |
| 5,013,683 A | 5/1991 | Petroff et al. |
| 5,028,565 A | 7/1991 | Chang et al. |
| 5,082,798 A | 1/1992 | Arimoto |
| 5,085,885 A | 2/1992 | Foley et al. |
| 5,091,320 A | 2/1992 | Aspnes et al. |
| 5,130,269 A | 7/1992 | Kitahara et al. |
| 5,166,092 A | 11/1992 | Mochizuki et al. |
| 5,173,474 A | 12/1992 | Connell et al. |
| 5,186,718 A | 2/1993 | Tepman et al. |
| 5,205,077 A | 4/1993 | Wittstock |
| 5,225,366 A | 7/1993 | Yoder |
| 5,234,561 A | 8/1993 | Randhawa et al. |
| 5,246,536 A | 9/1993 | Nishizawa et al. |
| 5,250,148 A | 10/1993 | Nishizawa et al. |
| 5,254,207 A | 10/1993 | Nishizawa et al. |
| 5,256,244 A | 10/1993 | Ackerman |
| 5,259,881 A | 11/1993 | Edwards et al. |
| 5,270,247 A | 12/1993 | Sakuma et al. |
| 5,278,435 A | 1/1994 | Van Hove et al. |
| 5,281,274 A | 1/1994 | Yoder |
| 5,286,296 A | 2/1994 | Sato et al. |
| 5,290,748 A | 3/1994 | Knuuttila et al. |
| 5,294,286 A | 3/1994 | Nishizawa et al. |
| 5,296,403 A | 3/1994 | Nishizawa et al. |
| 5,300,186 A | 4/1994 | Kitahara et al. |
| 5,306,666 A | 4/1994 | Izumi |
| 5,311,055 A | 5/1994 | Goodman et al. |
| 5,316,615 A | 5/1994 | Copel et al. |
| 5,316,793 A | 5/1994 | Wallace et al. |
| 5,330,610 A | 7/1994 | Eres et al. |
| 5,336,324 A | 8/1994 | Stall et al. |
| 5,338,389 A | 8/1994 | Nishizawa et al. |
| 5,348,911 A | 9/1994 | Jurgensen et al. |
| 5,374,570 A | 12/1994 | Nasu et al. |
| 5,395,791 A | 3/1995 | Cheng et al. |
| 5,438,952 A | 8/1995 | Otsuka |
| 5,439,876 A | 8/1995 | Graf et al. |
| 5,441,703 A | 8/1995 | Jurgensen et al. |
| 5,443,033 A | 8/1995 | Nishizawa et al. |
| 5,443,647 A | 8/1995 | Aucoin et al. |
| 5,455,072 A | 10/1995 | Bension et al. |
| 5,458,084 A | 10/1995 | Thorne et al. |
| 5,469,806 A | 11/1995 | Mochizuki et al. |
| 5,480,818 A | 1/1996 | Matsumoto et al. |
| 5,483,919 A | 1/1996 | Yokoyama et al. |
| 5,484,664 A | 1/1996 | Kitahara et al. |
| 5,503,876 A | 4/1996 | Fields et al. |
| 5,521,126 A | 5/1996 | Okamura et al. |
| 5,527,733 A | 6/1996 | Nishizawa et al. |
| 5,532,511 A | 7/1996 | Nishizawa et al. |
| 5,540,783 A | 7/1996 | Eres et al. |
| 5,580,380 A | 12/1996 | Liu et al. |
| 5,601,651 A | 2/1997 | Watabe |
| 5,609,689 A | 3/1997 | Kato et al. |
| 5,616,181 A | 4/1997 | Yamamoto et al. |
| 5,637,530 A | 6/1997 | Gaines et al. |
| 5,641,984 A | 6/1997 | Aftergut et al. |
| 5,644,128 A | 7/1997 | Wollnik et al. |
| 5,667,592 A | 9/1997 | Boitnott et al. |
| 5,674,786 A | 10/1997 | Turner et al. |
| 5,693,139 A | 12/1997 | Nishizawa et al. |
| 5,695,564 A | 12/1997 | Imahashi |
| 5,705,224 A | 1/1998 | Murota et al. |
| 5,707,880 A | 1/1998 | Aftergut et al. |
| 5,711,811 A | 1/1998 | Suntola et al. |
| 5,730,801 A | 3/1998 | Tepman et al. |
| 5,730,802 A | 3/1998 | Ishizumi et al. |
| 5,747,113 A | 5/1998 | Tsai et al. |
| 5,749,974 A | 5/1998 | Habuka et al. |
| 5,788,447 A | 8/1998 | Yonemitsu et al. |
| 5,788,799 A | 8/1998 | Steger et al. |
| 5,796,116 A | 8/1998 | Nakata et al. |
| 5,801,634 A | 9/1998 | Young et al. |
| 5,804,488 A | 9/1998 | Shih et al. |
| 5,807,792 A | 9/1998 | Ilg et al. |
| 5,830,270 A | 11/1998 | McKee et al. |
| 5,834,372 A | 11/1998 | Lee |
| 5,835,677 A | 11/1998 | Li et al. |
| 5,851,849 A | 12/1998 | Comizzoli et al. |
| 5,855,675 A | 1/1999 | Doering et al. |
| 5,855,680 A | 1/1999 | Soininen et al. |
| 5,856,219 A | 1/1999 | Naito et al. |
| 5,858,102 A | 1/1999 | Tsai |
| 5,866,213 A | 2/1999 | Foster et al. |
| 5,866,795 A | 2/1999 | Wang et al. |
| 5,879,459 A | 3/1999 | Gadgil et al. |
| 5,882,165 A | 3/1999 | Maydan et al. |
| 5,882,413 A | 3/1999 | Beaulieu et al. |
| 5,904,565 A | 5/1999 | Nguyen et al. |
| 5,916,365 A | 6/1999 | Sherman |
| 5,923,056 A | 7/1999 | Lee et al. |
| 5,923,985 A | 7/1999 | Aoki et al. |
| 5,925,574 A | 7/1999 | Aoki et al. |
| 5,928,389 A | 7/1999 | Jevtic |
| 5,942,040 A | 8/1999 | Kim et al. |
| 5,947,710 A | 9/1999 | Cooper et al. |
| 5,972,430 A | 10/1999 | DiMeo, Jr. et al. |
| 6,001,669 A | 12/1999 | Gaines et al. |
| 6,015,590 A | 1/2000 | Suntola et al. |
| 6,025,627 A | 2/2000 | Forbes et al. |
| 6,036,773 A | 3/2000 | Wang et al. |
| 6,042,652 A | 3/2000 | Hyun et al. |
| 6,043,177 A | 3/2000 | Falconer et al. |
| 6,051,286 A | 4/2000 | Zhao et al. |
| 6,062,798 A | 5/2000 | Muka |
| 6,071,808 A | 6/2000 | Merchant et al. |
| 6,084,302 A | 7/2000 | Sandhu |
| 6,086,677 A | 7/2000 | Umotoy et al. |
| 6,099,904 A | 8/2000 | Mak et al. |
| 6,110,556 A | 8/2000 | Bang et al. |
| 6,113,977 A | 9/2000 | Soininen et al. |
| 6,117,244 A | 9/2000 | Bang et al. |
| 6,124,158 A | 9/2000 | Dautartas et al. |
| 6,130,147 A | 10/2000 | Major et al. |
| 6,139,700 A | 10/2000 | Kang et al. |
| 6,140,237 A | 10/2000 | Chan et al. |
| 6,140,238 A | 10/2000 | Kitch |
| 6,143,659 A | 11/2000 | Leem |
| 6,144,060 A | 11/2000 | Park et al. |
| 6,156,382 A | 12/2000 | Rajagopalan et al. |

| | | | | | |
|---|---|---|---|---|---|
| 6,158,446 A | 12/2000 | Mohindra et al. | 2001/0009140 A1 | 7/2001 | Bondestam et al. |
| 6,174,377 B1 | 1/2001 | Doering et al. | 2001/0009695 A1 | 7/2001 | Saanila et al. |
| 6,174,809 B1 | 1/2001 | Kang et al. | 2001/0011526 A1 | 8/2001 | Doering et al. |
| 6,200,893 B1 | 3/2001 | Sneh | 2001/0024387 A1 | 9/2001 | Raaijmakers et al. |
| 6,203,613 B1 | 3/2001 | Gates et al. | 2001/0028924 A1 | 10/2001 | Sherman |
| 6,206,967 B1 | 3/2001 | Mak et al. | 2001/0029094 A1 | 10/2001 | Mee-Young et al. |
| 6,207,302 B1 | 3/2001 | Sugiura et al. | 2001/0031562 A1 | 10/2001 | Raaijmakers et al. |
| 6,207,487 B1 | 3/2001 | Kim et al. | 2001/0034123 A1 | 10/2001 | Jeon et al. |
| 6,218,298 B1 | 4/2001 | Hoinkis | 2001/0041250 A1 | 11/2001 | Werkhoven et al. |
| 6,248,605 B1 | 6/2001 | Harkonen et al. | 2001/0042799 A1 | 11/2001 | Kim et al. |
| 6,270,572 B1 | 8/2001 | Kim et al. | 2001/0054730 A1 | 12/2001 | Kim et al. |
| 6,271,148 B1 | 8/2001 | Kao et al. | 2001/0054769 A1 | 12/2001 | Raaijmakers et al. |
| 6,274,484 B1 | 8/2001 | Tsai et al. | 2002/0000598 A1 | 1/2002 | Kang et al. |
| 6,284,646 B1 | 9/2001 | Leem | 2002/0004293 A1 | 1/2002 | Soininen et al. |
| 6,287,965 B1 | 9/2001 | Kang et al. | 2002/0007790 A1 | 1/2002 | Park |
| 6,291,876 B1 | 9/2001 | Stumborg et al. | 2002/0019121 A1 | 2/2002 | Pyo |
| 6,305,314 B1 | 10/2001 | Sneh et al. | 2002/0031618 A1 | 3/2002 | Sherman |
| 6,306,098 B1 | 10/2001 | Orr et al. | 2002/0037630 A1 | 3/2002 | Agarwal et al. |
| 6,306,216 B1 | 10/2001 | Kim et al. | 2002/0048880 A1 | 4/2002 | Lee |
| 6,326,297 B1 | 12/2001 | Vijayendran | 2002/0052097 A1 | 5/2002 | Park |
| 6,333,260 B1 | 12/2001 | Kwon et al. | 2002/0055235 A1 | 5/2002 | Agarwal et al. |
| 6,335,280 B1 | 1/2002 | van der Jeugd | 2002/0060363 A1 | 5/2002 | Xi et al. |
| 6,342,277 B1 | 1/2002 | Sherman | 2002/0061612 A1 | 5/2002 | Sandhu et al. |
| 6,355,561 B1 | 3/2002 | Sandhu et al. | 2002/0066411 A1 | 6/2002 | Chiang et al. |
| 6,358,829 B2 | 3/2002 | Yoon et al. | 2002/0068458 A1 | 6/2002 | Chiang et al. |
| 6,368,954 B1 | 4/2002 | Lopatin et al. | 2002/0073924 A1 | 6/2002 | Chiang et al. |
| 6,369,430 B1 | 4/2002 | Adetutu et al. | 2002/0076481 A1 | 6/2002 | Chiang et al. |
| 6,372,598 B2 | 4/2002 | Kang et al. | 2002/0076507 A1 | 6/2002 | Chiang et al. |
| 6,391,785 B1 | 5/2002 | Satta et al. | 2002/0076508 A1 | 6/2002 | Chiang et al. |
| 6,399,491 B2 | 6/2002 | Jeon et al. | 2002/0076837 A1 | 6/2002 | Hujanen et al. |
| 6,416,822 B1 | 7/2002 | Chiang et al. | 2002/0086111 A1 | 7/2002 | Byun et al. |
| 6,420,189 B1 | 7/2002 | Lopatin | 2002/0086507 A1 | 7/2002 | Park et al. |
| 6,423,619 B1 | 7/2002 | Grant et al. | 2002/0090829 A1 | 7/2002 | Sandhu et al. |
| 6,428,859 B1 | 8/2002 | Chiang et al. | 2002/0094689 A1 | 7/2002 | Park |
| 6,447,933 B1 | 9/2002 | Wang et al. | 2002/0104481 A1 | 8/2002 | Chiang et al. |
| 6,451,119 B2 | 9/2002 | Sneh et al. | 2002/0105088 A1 | 8/2002 | Yang et al. |
| 6,451,695 B2 | 9/2002 | Sneh et al. | 2002/0106846 A1 | 8/2002 | Seutter et al. |
| 6,468,924 B2 | 10/2002 | Lee et al. | 2002/0109168 A1 | 8/2002 | Kim et al. |
| 6,475,276 B1 | 11/2002 | Elers et al. | 2002/0117399 A1 | 8/2002 | Chen et al. |
| 6,475,910 B1 | 11/2002 | Sneh | 2002/0121241 A1 | 9/2002 | Nguyen et al. |
| 6,482,262 B1 | 11/2002 | Elers et al. | 2002/0121342 A1 | 9/2002 | Nguyen et al. |
| 6,482,733 B2 | 11/2002 | Raaijmakers et al. | 2002/0121697 A1 | 9/2002 | Marsh |
| 6,482,740 B2 | 11/2002 | Soininen et al. | 2002/0144655 A1 | 10/2002 | Chiang et al. |
| 6,524,952 B1 | 2/2003 | Srinivas et al. | 2002/0144657 A1 | 10/2002 | Chiang et al. |
| 6,534,395 B2 | 3/2003 | Werkhoven et al. | 2002/0146511 A1 | 10/2002 | Chiang et al. |
| 6,534,404 B1 | 3/2003 | Danek et al. | 2002/0155722 A1 | 10/2002 | Satta et al. |
| 6,551,929 B1 * | 4/2003 | Kori et al. ............... 438/685 | 2002/0162506 A1 | 11/2002 | Sneh et al. |
| 6,569,501 B2 | 5/2003 | Chiang et al. | 2002/0164421 A1 | 11/2002 | Chiang et al. |
| 6,599,572 B2 | 7/2003 | Saanila et al. | 2002/0164423 A1 | 11/2002 | Chiang et al. |
| 6,607,976 B2 | 8/2003 | Chen et al. | 2002/0182320 A1 | 12/2002 | Leskela et al. |
| 6,607,977 B1 | 8/2003 | Rozbicki et al. | 2002/0187256 A1 | 12/2002 | Elers et al. |
| 6,620,723 B1 | 9/2003 | Byun et al. | 2002/0187631 A1 | 12/2002 | Kim et al. |
| 6,627,268 B1 | 9/2003 | Fair et al. | 2002/0197402 A1 | 12/2002 | Chaing et al. |
| 6,630,201 B2 | 10/2003 | Chiang et al. | 2002/0197863 A1 | 12/2002 | Mak et al. |
| 6,635,965 B1 | 10/2003 | Lee et al. | 2003/0013300 A1 | 1/2003 | Byun |
| 6,660,126 B2 | 12/2003 | Nguyen et al. | 2003/0013320 A1 | 1/2003 | Kim et al. |
| 6,686,271 B2 | 2/2004 | Raaijmakers et al. | 2003/0031807 A1 | 2/2003 | Elers et al. |
| 6,713,373 B1 | 3/2004 | Omstead | 2003/0032281 A1 | 2/2003 | Werkhoven et al. |
| 6,720,260 B1 | 4/2004 | Fair et al. | 2003/0038369 A1 | 2/2003 | Layadi et al. |
| 6,764,940 B1 | 7/2004 | Rozbicki et al. | 2003/0049931 A1 | 3/2003 | Byun et al. |
| 6,790,773 B1 | 9/2004 | Drewery et al. | 2003/0049942 A1 | 3/2003 | Haukka et al. |
| 6,797,642 B1 | 9/2004 | Chu et al. | 2003/0053799 A1 | 3/2003 | Lai |
| 6,815,285 B2 | 11/2004 | Choi et al. | 2003/0054631 A1 | 3/2003 | Raaijmakers et al. |
| 6,821,889 B2 | 11/2004 | Elers et al. | 2003/0072975 A1 | 4/2003 | Shero et al. |
| 6,878,402 B2 | 4/2005 | Chiang et al. | 2003/0082296 A1 | 5/2003 | Elers et al. |
| 6,893,915 B2 | 5/2005 | Park et al. | 2003/0082301 A1 | 5/2003 | Chen et al. |
| 6,936,538 B2 | 8/2005 | Byun | 2003/0104126 A1 | 6/2003 | Fang et al. |
| 6,958,174 B1 | 10/2005 | Klaus et al. | 2003/0116087 A1 | 6/2003 | Nguyen et al. |
| 7,005,372 B2 | 2/2006 | Levy et al. | 2003/0123216 A1 | 7/2003 | Yoon et al. |
| 7,101,795 B1 * | 9/2006 | Xi et al. ............... 438/685 | 2003/0129826 A1 | 7/2003 | Werkhoven et al. |
| 7,115,494 B2 * | 10/2006 | Sinha et al. ............... 438/607 | 2003/0134508 A1 | 7/2003 | Raaijmakers et al. |
| 2001/0000866 A1 | 5/2001 | Sneh et al. | 2003/0143328 A1 | 7/2003 | Chen et al. |
| 2001/0002280 A1 | 5/2001 | Sneh | 2003/0143839 A1 | 7/2003 | Raaijmakers et al. |

| | | | | | | |
|---|---|---|---|---|---|---|
| 2003/0153181 A1 | 8/2003 | Yoon et al. | | JP | 01-264218 | 10/1989 |
| 2003/0161952 A1 | 8/2003 | Wang et al. | | JP | 01-270593 | 10/1989 |
| 2003/0186495 A1 | 10/2003 | Saanila et al. | | JP | 01-272108 | 10/1989 |
| 2003/0190423 A1 | 10/2003 | Yang et al. | | JP | 01-290221 | 11/1989 |
| 2003/0190804 A1 | 10/2003 | Glenn et al. | | JP | 01-290222 | 11/1989 |
| 2003/0194493 A1 | 10/2003 | Chang et al. | | JP | 01-296673 | 11/1989 |
| 2003/0194825 A1 | 10/2003 | Law et al. | | JP | 01-303770 | 12/1989 |
| 2003/0194858 A1 | 10/2003 | Lee et al. | | JP | 01-305894 | 12/1989 |
| 2003/0203616 A1 | 10/2003 | Chung et al. | | JP | 01-313927 | 12/1989 |
| 2003/0224217 A1 | 12/2003 | Byun et al. | | JP | 02-012814 | 1/1990 |
| 2004/0005749 A1 | 1/2004 | Choi et al. | | JP | 02-014513 | 1/1990 |
| 2004/0009307 A1 | 1/2004 | Koh et al. | | JP | 02-017634 | 1/1990 |
| 2004/0011504 A1 | 1/2004 | Ku et al. | | JP | 02-063115 | 3/1990 |
| 2004/0013577 A1 | 1/2004 | Ganguli et al. | | JP | 02-074029 | 3/1990 |
| 2004/0014315 A1 | 1/2004 | Lai et al. | | JP | 02-074587 | 3/1990 |
| 2004/0014320 A1 | 1/2004 | Cheng et al. | | JP | 02-106822 | 4/1990 |
| 2004/0015300 A1 | 1/2004 | Ganguli et al. | | JP | 02-129913 | 5/1990 |
| 2004/0018304 A1 | 1/2004 | Chung et al. | | JP | 02-162717 | 6/1990 |
| 2004/0018723 A1 | 1/2004 | Byun et al. | | JP | 02-172895 | 7/1990 |
| 2004/0041320 A1 | 3/2004 | Hodumi | | JP | 02-196092 | 8/1990 |
| 2004/0202789 A1 | 10/2004 | Wongsenakhum et al. | | JP | 02-203517 | 8/1990 |
| 2005/0006799 A1 | 1/2005 | Brock et al. | | JP | 02-230690 | 9/1990 |
| 2005/0031786 A1 | 2/2005 | Lee et al. | | JP | 02-230722 | 9/1990 |
| 2005/0064098 A1 | 3/2005 | Elers et al. | | JP | 02-246161 | 10/1990 |
| 2006/0128132 A1 | 6/2006 | Sinha et al. | | JP | 02-264491 | 10/1990 |
| | | | | JP | 02-283084 | 11/1990 |
| FOREIGN PATENT DOCUMENTS | | | | JP | 02-304916 | 12/1990 |
| DE | 196 27 017 | 1/2000 | | JP | 03-019211 | 1/1991 |
| EP | 0 344 352 | 12/1989 | | JP | 03-022589 | 1/1991 |
| EP | 0 429 270 | 5/1991 | | JP | 03-023294 | 1/1991 |
| EP | 0 442 490 | 8/1991 | | JP | 03-023299 | 1/1991 |
| EP | 0 799 641 | 10/1997 | | JP | 03-044967 | 2/1991 |
| EP | 1 167 569 | 1/2002 | | JP | 03-048421 | 3/1991 |
| FR | 2 626 110 | 7/1989 | | JP | 03-070124 | 3/1991 |
| FR | 2 692 597 | 12/1993 | | JP | 03-185716 | 8/1991 |
| GB | 2 355 727 | 5/2001 | | JP | 03-208885 | 9/1991 |
| JP | 58-098917 | 6/1983 | | JP | 03-234025 | 10/1991 |
| JP | 58-100419 | 6/1983 | | JP | 03-286522 | 12/1991 |
| JP | 60-065712 | 4/1985 | | JP | 03-286531 | 12/1991 |
| JP | 61-035847 | 2/1986 | | JP | 04-031391 | 2/1992 |
| JP | 61-210623 | 9/1986 | | JP | 04-031396 | 2/1992 |
| JP | 61-069508 | 3/1987 | | JP | 04-100292 | 4/1992 |
| JP | 62-091495 | 4/1987 | | JP | 04-111418 | 4/1992 |
| JP | 62-141717 | 6/1987 | | JP | 04-132214 | 5/1992 |
| JP | 62-167297 | 7/1987 | | JP | 04-132681 | 5/1992 |
| JP | 62-171999 | 7/1987 | | JP | 04-151822 | 5/1992 |
| JP | 62-232919 | 10/1987 | | JP | 04-162418 | 6/1992 |
| JP | 63-062313 | 3/1988 | | JP | 04-175299 | 6/1992 |
| JP | 63-085098 | 4/1988 | | JP | 04-186824 | 7/1992 |
| JP | 63-090833 | 4/1988 | | JP | 04-212411 | 8/1992 |
| JP | 63-222420 | 9/1988 | | JP | 04-260696 | 9/1992 |
| JP | 63-222421 | 9/1988 | | JP | 04-273120 | 9/1992 |
| JP | 63-227007 | 9/1988 | | JP | 04-285167 | 10/1992 |
| JP | 63-252420 | 10/1988 | | JP | 04-291916 | 10/1992 |
| JP | 63-266814 | 11/1988 | | JP | 04-325500 | 11/1992 |
| JP | 64-009895 | 1/1989 | | JP | 04-328874 | 11/1992 |
| JP | 64-009896 | 1/1989 | | JP | 05-029228 | 2/1993 |
| JP | 64-009897 | 1/1989 | | JP | 05-047665 | 2/1993 |
| JP | 64-037832 | 2/1989 | | JP | 05-047666 | 2/1993 |
| JP | 64-082615 | 3/1989 | | JP | 05-047668 | 2/1993 |
| JP | 64-082617 | 3/1989 | | JP | 05-074717 | 3/1993 |
| JP | 64-082671 | 3/1989 | | JP | 05-074724 | 3/1993 |
| JP | 64-082676 | 3/1989 | | JP | 05-102189 | 4/1993 |
| JP | 01-103982 | 4/1989 | | JP | 05-160152 | 6/1993 |
| JP | 01-103996 | 4/1989 | | JP | 05-175143 | 7/1993 |
| JP | 64-090524 | 4/1989 | | JP | 05-175145 | 7/1993 |
| JP | 01-117017 | 5/1989 | | JP | 05-182906 | 7/1993 |
| JP | 01-143221 | 6/1989 | | JP | 05-186295 | 7/1993 |
| JP | 01-143233 | 6/1989 | | JP | 05-206036 | 8/1993 |
| JP | 01-154511 | 6/1989 | | JP | 05-234899 | 9/1993 |
| JP | 01-236657 | 9/1989 | | JP | 05-235047 | 9/1993 |
| JP | 01-245512 | 9/1989 | | JP | 05-251339 | 9/1993 |
| | | | | JP | 05-270997 | 10/1993 |

| | | |
|---|---|---|
| JP | 05-283336 | 10/1993 |
| JP | 05-291152 | 11/1993 |
| JP | 05-304334 | 11/1993 |
| JP | 05-343327 | 12/1993 |
| JP | 05-343685 | 12/1993 |
| JP | 06-045606 | 2/1994 |
| JP | 06-132236 | 5/1994 |
| JP | 06-177381 | 6/1994 |
| JP | 06-196809 | 7/1994 |
| JP | 06-222388 | 8/1994 |
| JP | 06-224138 | 8/1994 |
| JP | 06-230421 | 8/1994 |
| JP | 06-252057 | 9/1994 |
| JP | 06-291048 | 10/1994 |
| JP | 07-070752 | 3/1995 |
| JP | 07-086269 | 3/1995 |
| JP | 08-181076 | 7/1996 |
| JP | 08-245291 | 9/1996 |
| JP | 08-264530 | 10/1996 |
| JP | 09-260786 | 10/1997 |
| JP | 09-293681 | 11/1997 |
| JP | 10-188840 | 7/1998 |
| JP | 10-190128 | 7/1998 |
| JP | 10-308283 | 11/1998 |
| JP | 11-269652 | 10/1999 |
| JP | 2000-031387 | 1/2000 |
| JP | 2000-058777 | 2/2000 |
| JP | 2000-068072 | 3/2000 |
| JP | 2000-087029 | 3/2000 |
| JP | 2000-138094 | 5/2000 |
| JP | 2000-178735 | 6/2000 |
| JP | 2000-218445 | 8/2000 |
| JP | 2000-319772 | 11/2000 |
| JP | 2000-340883 | 12/2000 |
| JP | 2000-353666 | 12/2000 |
| JP | 2001-020075 | 1/2001 |
| JP | 2001-062244 | 3/2001 |
| JP | 2001-111000 | 4/2001 |
| JP | 2001-152339 | 6/2001 |
| JP | 2001-172767 | 6/2001 |
| JP | 2001-189312 | 7/2001 |
| JP | 2001-217206 | 8/2001 |
| JP | 2001-220287 | 8/2001 |
| JP | 2001-220294 | 8/2001 |
| JP | 2001-240972 | 9/2001 |
| JP | 2001-254181 | 9/2001 |
| JP | 2001-284042 | 10/2001 |
| JP | 2001-303251 | 10/2001 |
| JP | 2001-328900 | 11/2001 |
| WO | WO 90/02216 | 3/1990 |
| WO | WO 91/10510 | 7/1991 |
| WO | WO 93/02111 | 2/1993 |
| WO | WO 96/17107 | 6/1996 |
| WO | WO 96/18756 | 8/1996 |
| WO | WO 98/06889 | 2/1998 |
| WO | WO 98/51838 | 11/1998 |
| WO | WO 99/01595 | 1/1999 |
| WO | WO 99/13504 | 3/1999 |
| WO | WO 99/29924 | 6/1999 |
| WO | WO 99/41423 | 8/1999 |
| WO | WO 00/11721 | 3/2000 |
| WO | WO 00/15865 | 3/2000 |
| WO | WO 00/15881 | 3/2000 |
| WO | WO 00/16377 | 3/2000 |
| WO | WO 00/54320 | 9/2000 |
| WO | WO 00/63957 | 10/2000 |
| WO | WO 00/79019 | 12/2000 |
| WO | WO 00/79576 | 12/2000 |
| WO | WO 01/15220 | 3/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/36702 | 5/2001 |
| WO | WO 01/40541 | 6/2001 |
| WO | WO 01/66832 | 9/2001 |
| WO | WO 02/01628 | 1/2002 |
| WO | WO 02/45167 | 6/2002 |
| WO | WO 02/45871 | 6/2002 |
| WO | WO 02/46489 | 6/2002 |
| WO | WO 02/067319 | 8/2002 |

OTHER PUBLICATIONS

Bedair "Atomic Layer Epitaxy Deposition Processes," J. Vac. Sci. Techol. 12(1) (Jan./Feb. 1994).

Choe, et al. "Stability of $TiB_2$ as a Diffusion Barrier on Silicon," J. Electrochem. Soc. 138(10) (Oct. 1991), pp. 3062-3067.

Choi, et al. "The Effect of Annealing on Resistivity of Low Pressure Chemical Vapor Deposited Titanium Diboride," J. Appl. Phys. 69(11) (Jun. 1, 1991), pp. 7853-7861.

Derbyshire "Applications of Integrated Processing," Solid State Technology, US, Cowan Pub., vol. 37, No. 12 (Dec. 1, 1994), pp. 45-47.

Elam, et al. "Nucleation and Growth During Tungsten Atomic Layer Deposition on $SiO_2$ Surfaces," Thin Solid Films 386 (2001), pp. 41-52.

Elers, et al. "$NbCl_5$ As a Precursor in Atomic Layer Epitaxy," Appl. Surf. Sci., vol. 82/83 (1994), pp. 468-474.

George, et al. "Atomic Layer Controlled Deposition of $SiO_2$ and $Al_2O_3$ Using ABAB . . . Binary Reaction Sequence Chemistry," Appl. Surf. Sci., vol. 82/83 (1994), pp. 460-467.

George, et al. "Surface Chemistry for Atomic Layer Growth," J. Phys. Chem., vol. 100 (1996), pp. 13121-13131.

Goswami, et al. "Transition Metals Show Promise as Copper Barriers," Semiconductor International, ATMI, San Jose—May 1, 2004, Semiconductor International, pp. 1-7.

Hultman, et al. "Review of the Thermal and Mechanical Stability of TiN-based Thin Films," Zeitschrift Fur Metallkunde, 90(10) (Oct. 1999), pp. 803-813.

IBM Tech. Disc. Bull. "Knowledge-Based Dynamic Scheduler in Distributed Computer Control," (Jun. 1990), pp. 80-84.

IBM Tech. Disc. Bull. "Multiprocessor and Multitasking Architecture for Tool Control of the Advanced via Inspection Tools," (May 1992), pp. 190-191.

Kim, et al. "Atomic Layer Deposition of Low Resistivity and High-Density Tungsten Nitride Thin Film Using $B_2H_6$, $WF_6$ and $NH_3$," Electrochem. Solid-State Lett., vol. 9, Issue 3, (2006), pp. C54-C57.

Kitigawa, et al. "Hydrogen-mediated Low Temperature Epitaxy of Si in Plasma-enhanced Chemical Vapor Deposition," Applied Surface Science (2000), pp. 30-34.

Klaus, et al. "Atomic Layer Deposition of $SiO_2$ Using Catalyzed and Uncatalyzed Self-Limiting Surface Reactions," Surface Review & Letters, 6(3&4) (1999), pp. 435-448.

Klaus, et al. "Atomic Layer Deposition of Tungsten using Sequential Surface Chemistry with a Sacrificial Stripping Reaction," Thin Solid Films 360 (2000), pp. 145-153. (Accepted Nov. 16, 1999).

Klaus, et al. "Atomically Controlled Growth of Tungsten and Tungsten Nitride Using Sequential Surface Reactions," Applied Surface Science, vol. 162-163 (2000), pp. 479-491.

Lee, "The Preparation of Titanium-Based Thin Film by CVD Using Titanium Chlorides as Precursors," Chemical Vapor Deposition, 5(2) (Mar. 1999), pp. 69-73.

Lee, et al. "Pulsed Nucleation for Ultra-High Aspect Ratio Tungsten Plugfill," Materials Research Society, 2002, pp. 649-653.

Martensson, et al. "Atomic Layer Epitaxy of Copper on Tantalum," Chemical Vapor Deposition, 3(1) (Feb. 1, 1997), pp. 45-50.

Martensson, et al. "Atomic Layer Epitaxy of Copper, Growth & Selectivity in the Cu (II)-2,2,6,6-Tetramethyl-3, 5-Heptanedion ATE/H2 Process," J. Electrochem. Soc., 145(8) (Aug. 1998), pp. 2926-2931.

Maydan "Cluster Tools for Fabrication of Advanced Devices," Jap. J. of Applied Physics, Extended Abstracts, 22nd Conference Solid State Devices and Materials (1990), pp. 849-852.

McGeachin "Synthesis and Properties of Some β-diketimines Derived From Acetylacetone, and Their Metal Complexes," Canadian J. of Chemistry, vol. 46 (1968), pp. 1903-1912.

Min, et al. "Atomic Layer Deposition of TiN Thin Films by Sequential Introduction of Ti Precursor and $NH_3$," Symp.: Advanced Interconnects and Contact Materials and Processes for Future Integrated Circuits (Apr. 13-16, 1998), pp. 337-342.

Min, et al. "Chemical Vapor Deposition of Ti-Si-N Films with Alternating Source Supply," Mat., Res. Soc. Symp. Proc., vol. 564 (Apr. 5, 1999), pp. 207-210.

Min, et al. "Metal-Organic Atomic-Layer Deposition of Titanium-Silicon-Nitride Films," Applied Physics Letters, American Inst. Of Physics, vol. 75, (11) (Sep. 13, 1999).

Niinisto, et al. "Synthesis of Oxide Thin Films and Overlayers by Atomic Layer Epitaxy for Advanced Applications," Mat. Sci. & Eng., vol. B41 (1996), pp. 23-29.

Ohba, et al. "Thermal Decomposition of Methylhydrazine and Deposition Properties of CVD TiN Thin Films," Conference Proceedings, Advanced Metallization of ULSI Applications in 1993 (1994), pp. 143-149.

Ritala, et al. "Atomic Layer Epitaxy Growth of TiN Thin Films," J. Electrochem. Soc., 142(8) (Aug. 1995), pp. 2731-2737.

Ritala, et al. "Perfectly Conformal TiN and $Al_2O_3$ Films Deposited by Atomic Layer Deposition," Chemical Vapor Deposition, vol. 5(1) (Jan. 1999), pp. 7-9.

Rossnagel, et al. "Plasma-enhanced Atomic Layer Deposition of Ta and Ti for Interconnect Diffusion Barriers," J. Vac. Sci. Technol. B, 18(4) (Jul./Aug. 2000), pp. 2016-2020.

Scheper, et al. "Low-temperature Deposition of Titanium Nitride Films From Dialkylhydrazine-based Precursors," Materials Science in Semiconductor Processing 2 (1999), pp. 149-157.

Solanki, et al. "Atomic Layer Deposition of Copper Seed Layers," Electrochemical and Solid State Letters, 3(10) (2000), pp. 479-480.

Suzuki, et al. "A 0.2-µm Contact Filing by 450° C.-hydrazine-reduced TiN film With Low Resistivity," IEDM 92-979, pp. 11.8.1-11.8.3.

Suzuki, et al. "LPCVD-TiN Using Hydrazine and $TiCl_4$," VMIC Conference (Jun. 8-9, 1993), pp. 418-423.

Wise, et al. "Diethyldiethoxysilane as a New Precursor for $SiO_2$ Growth on Silicon", Mat. Res. Soc. Symp. Proc., vol. 334 (1994), pp. 37-43.

Yamaga, et al. "Atomic Layer Epitaxy of ZnS by a New Gas Supplying System in a Low-pressure Metalorganic Vapor Phase Epitaxy," J. of Crystal Growth 117 (1992), pp. 152-155.

Yamaguchi, et al. "Atomic-layer Chemical-Vapor-Deposition of Silicon Dioxide Films With Extremely Low Hydrogen Content," Appl. Surf. Sci., vol. 130-132 (1998), pp. 202-207.

Yang, et al. "Atomic Layer Deposition of Tungsten Films from $WF_6/B_2H_6$: Nucleation Layer for Advanced Semiconductor Device," Conference Proceedings ULSI XVII (2002) Materials Research Society, pp. 655-660.

* cited by examiner

METHOD FOR FORMING TUNGSTEN MATERIALS DURING VAPOR DEPOSITION PROCESSES

CROSS-REFERENCE TO RELATED APPLICATIONS

This application is a continuation of U.S. Ser. No. 11/338,565, filed Jan. 24, 2006, and issued as U.S. Pat. No. 7,115,494, which is a continuation of U.S. Ser. No. 10/951,354, filed Sep. 29, 2004, and issued as U.S. Pat. No. 7,033,922, which is a continuation of U.S. Ser. No. 09/625,336, filed Jul. 25, 2000, and issued as U.S. Pat. No. 6,855,368, which is a divisional of U.S. Ser. No. 09/605,593, filed Jun. 28, 2000, and issued as U.S. Pat. No. 6,551,929, which are herein incorporated by reference in their entirety.

BACKGROUND OF THE INVENTION

1. Field of the Invention

This invention relates to the processing of semiconductor substrates. More particularly, this invention relates to improvements in the process of depositing refractory metal layers on semiconductor substrates.

2. Description of the Related Art

The semiconductor processing industry continues to strive for larger production yields while increasing the uniformity of layers deposited on substrates having increasing larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer. Chemical vapor deposition (CVD) is one of the most common deposition processes employed for depositing layers on a substrate. CVD is a flux-dependent deposition technique that requires precise control of the substrate temperature and precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates superior step coverage, compared to CVD, is atomic layer deposition (ALD). ALD is based upon atomic layer epitaxy (ALE) that was originally employed to fabricate electroluminescent displays. ALD employs chemisorption to deposit a saturated monolayer of reactive precursor molecules on a substrate surface. This is achieved by alternatingly pulsing an appropriate reactive precursor into a deposition chamber. Each injection of a reactive precursor is separated by an inert gas purge to provide a new atomic layer additive to previous deposited layers to form a uniform layer on the substrate. The cycle is repeated to form the layer to a desired thickness. A drawback with ALD techniques is that the deposition rate is much lower than typical CVD techniques by at least one order of magnitude.

Employing the aforementioned deposition techniques it is seen that formation of a layer at a high deposition rate while providing adequate step coverage are conflicting characteristics often necessitating sacrificing one to obtain the other. This has been prevalent when depositing refractory metal layers to cover gaps or vias during formation of contacts that interconnect adjacent metallic layers separated by a dielectric layer. Historically, CVD techniques have been employed to deposit conductive material in order to inexpensively and quickly form contacts. Due to the increasing integration of semiconductor circuitry, tungsten has been used based upon the superior step coverage of tungsten. As a result, deposition of tungsten employing CVD techniques enjoys wide application in semiconductor processing due to the high throughput of the process.

Depositing tungsten in this manner, however, is attendant with several disadvantages. For example, blanket deposition of a tungsten layer on a semiconductor wafer is time-consuming at temperatures below 400° C. The deposition rate of tungsten may be improved by increasing the deposition temperature to, e.g., about 500° C. to about 550° C. Temperatures in this range may compromise the structural and operational integrity of the underlying portions of the integrated circuit being formed. Tungsten has also frustrated photolithography steps during the manufacturing process by providing a relatively rough surface having a reflectivity of 20% or less than that of a silicon substrate. Finally, tungsten has proven difficult to deposit uniformly. This has been shown by variance in tungsten layers' thickness of greater than 1%, which frustrates control of the resistivity of the layer. Several prior attempts to overcome the aforementioned drawbacks have been attempted.

For example, in U.S. Pat. No. 5,028,565, which is assigned to the assignee of the present invention, a method is disclosed to improve, inter alia, uniformity of tungsten layers by varying the deposition chemistry. The method includes, in pertinent part, formation of a nucleation layer over an intermediate barrier layer before depositing the tungsten layer via bulk deposition. The nucleation layer is formed from a gaseous mixture of tungsten hexafluoride, hydrogen, silane and argon. The nucleation layer is described as providing a layer of growth sites to promote uniform deposition of a tungsten layer. The benefits provided by the nucleation layer are described as being dependent upon the barrier layer present. For example, were the barrier layer formed from titanium nitride the tungsten layer's thickness uniformity is improved as much as 15%. The benefits provided by the nucleation layer are not substantial if the barrier layer is formed from sputtered tungsten or sputtered titanium tungsten.

A need exists, therefore, to provide techniques to improve the characteristics of refractory metal layers deposited on semiconductor substrates.

SUMMARY OF THE INVENTION

A method and system reduces the resistance of contacts of refractory metal layers by controlling the presence of fluorine contained therein. The present invention is based upon the discovery that when employing ALD techniques to form refractory metal layers on a substrate, the carrier gas employed impacts the presence of fluorine in the resulting layer. As a result, the method features chemisorbing onto the substrate alternating monolayers of a first compound and a second compound, with the second compound having fluorine atoms associated therewith, with each of the first and second compounds being introduced into the processing chamber along with a carrier gas; and controlling a quantity of the fluorine atoms associated with the monolayer of the second compound as a function of the carrier gas. Specifically, it was found that by introducing the first and second compounds employing $H_2$ as a carrier gas, the amount of fluorine present in the resulting refractory metal layer was substantially reduced, compared to employing either nitrogen (N₂) or argon (Ar) as a carrier gas.

To that end, the system includes a processing chamber, having a holder, disposed therein to support the substrate. A gas delivery system and a pressure control system are in fluid communication with the processing chamber. A temperature control system is in thermal communication therewith. A controller is in electrical communication with gas delivery system, temperature control system, and the pressure control system. A memory is in data communication with the controller. The memory comprises a computer-readable medium having a computer-readable program embodied therein. The computer-readable program includes instructions for controlling the operation of the processing chamber.

DETAILED DESCRIPTION OF THE INVENTION

Figure 1:
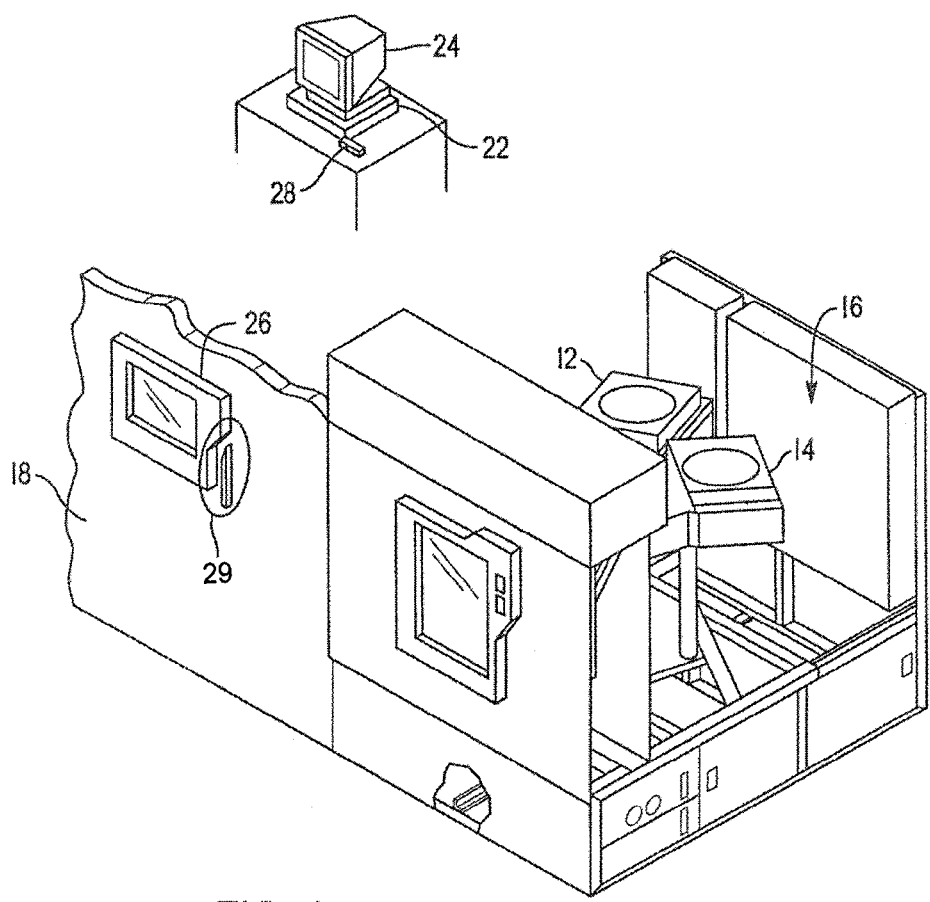
FIG. 1 is a perspective view of a semiconductor processing system in accordance with the present invention.

Referring to FIG. 1, an exemplary wafer processing system includes two or more processing chambers 12 and 14 disposed in a common work area 16 surrounded by a wall 18. The processing chambers 12 and 14 are in data communication with a controller 22 that is connected to one or more monitors, shown as 24 and 26. The monitors typically display common information concerning the process associated with the processing chambers 12 and 14. One of the monitors 26 is mounted to the wall 18, with the remaining monitor 24 being disposed in the work area 16. Operational control of the processing chambers 12 and 14 may be achieved use of a light pen, associated with one of the monitors 24 and 26, to communicate with the controller 22. For example, light pen 28 is associated with monitor 24 and facilitates communication with the controller 22 through monitor 24. Light pen 29 facilitates communication with the controller 22 through monitor 26.

Figure 2:
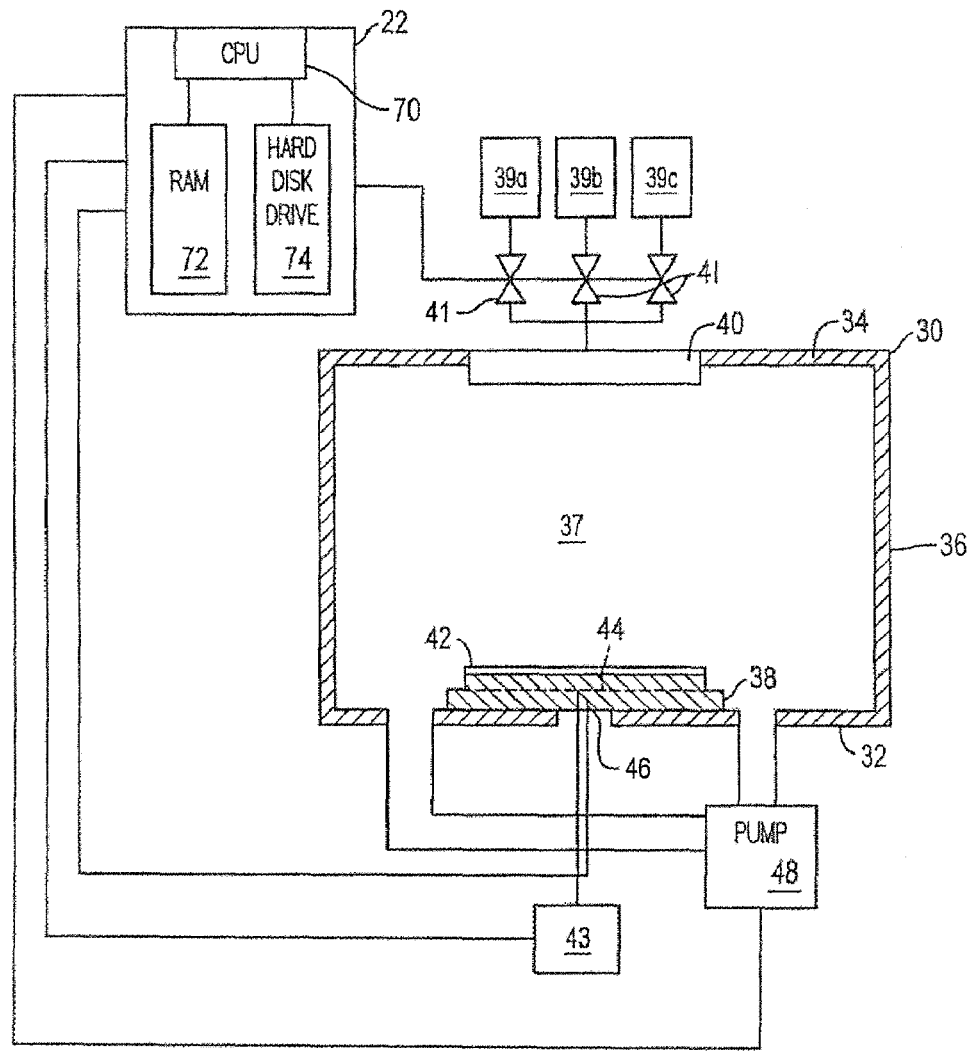
FIG. 2 is a detailed view of the processing chambers shown above in FIG. 1.

Referring both to FIGS. 1 and 2, each of the processing chambers 12 and 14 includes a housing 30 having a base wall 32, a cover 34, disposed opposite to the base wall 32, and a sidewall 36, extending therebetween. The housing 30 defines a chamber 37, and a pedestal 38 is disposed within the processing chamber 37 to support a substrate 42, such as a semiconductor wafer. The pedestal 38 may be mounted to move between the cover 34 and the base wall 32, using a displacement mechanism (not shown). Supplies of processing gases 39a, 39b, and 39c are in fluid communication with the processing chamber 37 via a showerhead 40. Regulation of the flow of gases from the supplies 39a, 39b and 39c is effectuated via flow valves 41.

Depending on the specific process, the substrate 42 may be heated to a desired temperature prior to layer deposition via a heater embedded within the pedestal 38. For example, the pedestal 38 may be resistively heated by applying an electric current from an AC power supply 43 to the heater element 44. The wafer 40 is, in turn, heated by the pedestal 38, and can be maintained within a desired process temperature range of, for example, about 20° C. to about 750° C. A temperature sensor 46, such as a thermocouple, is also embedded in the wafer support pedestal 38 to monitor the temperature of the pedestal 38 in a conventional manner. For example, the measured temperature may used in a feedback loop to control the electrical current applied to the heater element 44 by the power supply 43, such that the wafer temperature can be maintained or controlled at a desired temperature which is suitable for the particular process application. The pedestal 38 is optionally heated using radiant heat (not shown). A vacuum pump 48 is used to evacuate the processing chamber 37 and to help maintain the proper gas flows and pressure inside the processing chamber 37.

Figure 3:
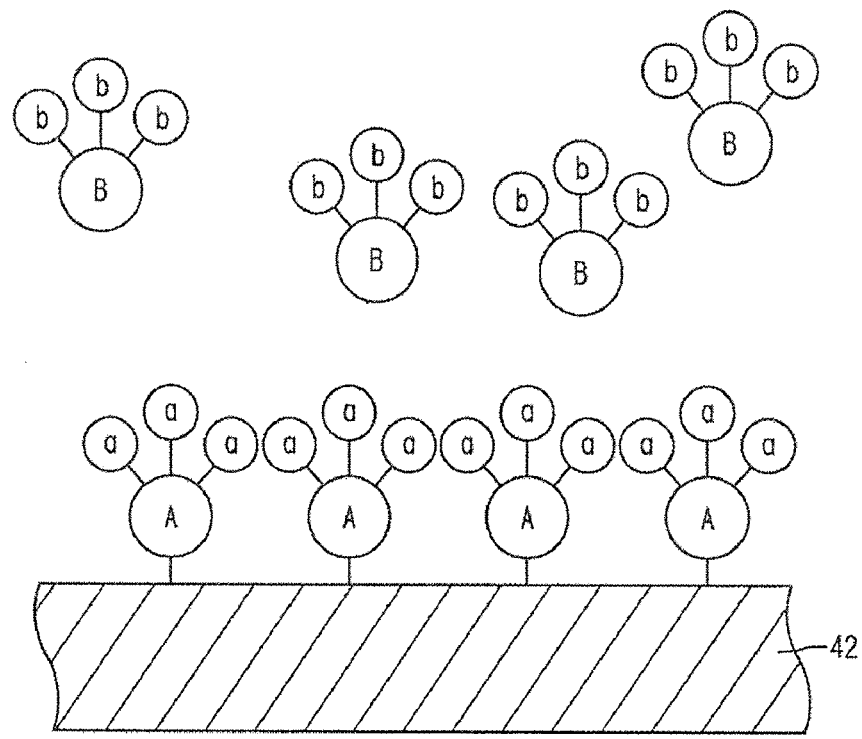
FIG. 3 is a schematic view showing deposition of a first molecule onto a substrate during ALD.

Referring to FIGS. 1 and 3, one or both of the processing chambers 12 and 14, discussed above may operate to deposit refractory metal layers on the substrate employing ALD techniques. Depending on the specific stage of processing, the refractory metal layer may be deposited on the material from which the substrate 42 is fabricated, e.g., SiO₂. The refractory metal layer may also be deposited on a layer previously formed on the substrate 42, e.g., titanium, titanium nitride and the like.

ALD proceeds by chemisorption. The initial surface of the substrate 42 presents an active ligand to the process region. A batch of a first processing gas, in this case $Aa_x$, results in a layer of A being deposited on the substrate 42 having a surface of ligand "a" exposed to the processing chamber 37. Thereafter, a purge gas enters the processing chamber 37 to purge the gas $Aa_x$. After purging gas $Aa_x$ from the processing chamber 37, a second batch of processing gas, $Bb_y$, is introduced into the processing chamber 37. The a ligand present on the substrate surface reacts with the b ligand and B atom on the, releasing molecules ab and Ba, that move away from the substrate 42 and are subsequently pumped from the processing chamber 37. In this manner, a surface comprising a monolayer of A atoms remains upon the substrate 42 and exposed to the processing chamber 37, shown in FIG. 4. The process proceeds cycle after cycle, until the desired thickness is achieved.

Figure 5:
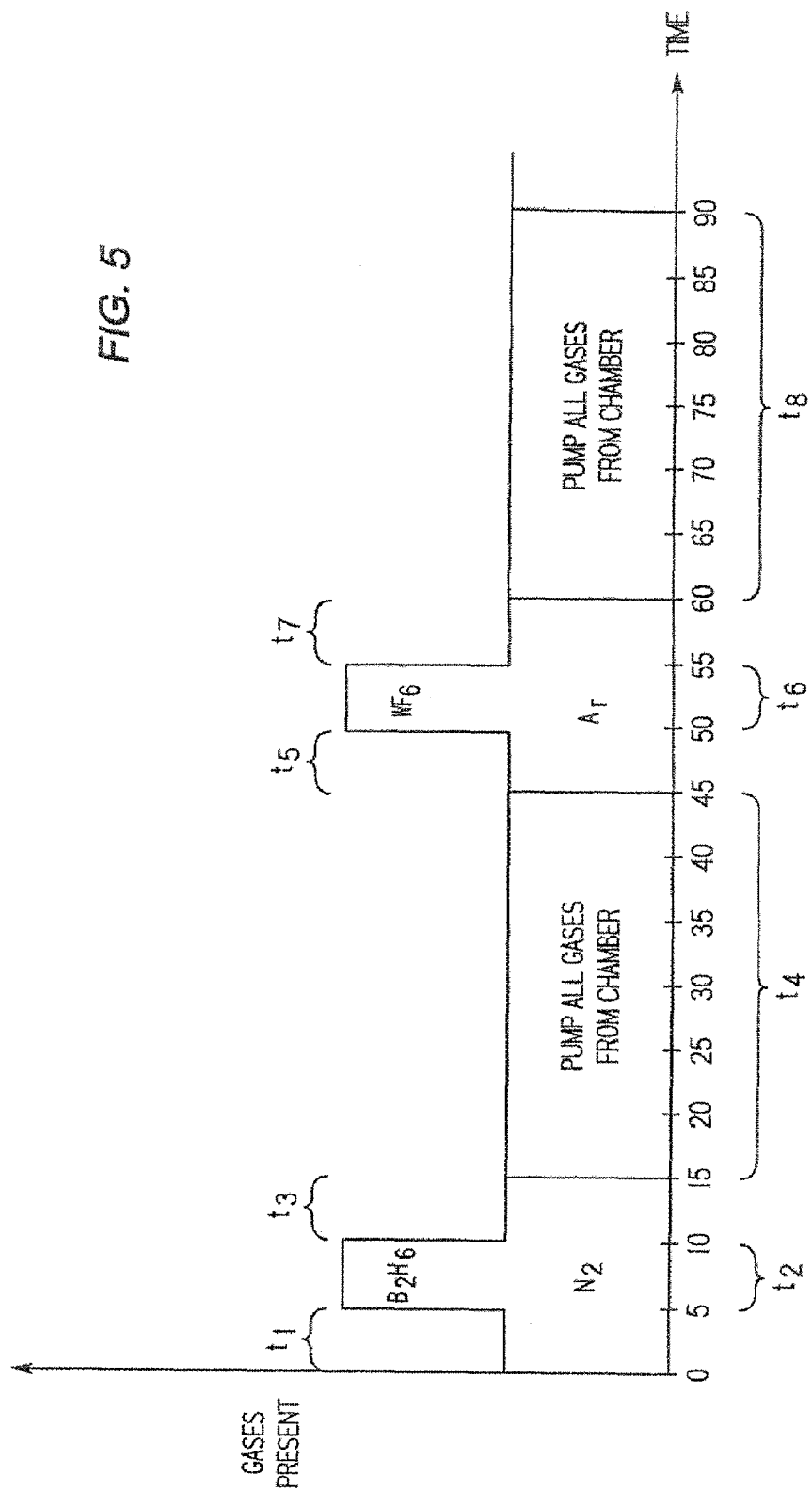
FIG. 5 is a graphical representation showing the concentration of gases introduced into the processing chamber shown above in FIG. 2, and the time in which the gases are present in the processing chamber, in accordance with the present invention.

Referring to both FIGS. 2 and 5, although any type of processing gas may be employed, in the present example, the processing gas $Aa_x$ is $WF_6$ and the processing gas $Bb_y$ is $B_2H_6$. Two purge gases were employed: Ar and $N_2$. Each of the processing gases is flowed into the processing chamber 37 with a carrier gas, which in this example is one of the purge gases: $WF_6$ is introduced with Ar and $B_2H_6$ is introduced with $N_2$. It should be understood, however, that the purge gas may differ from the carrier gas, discussed more fully below. One cycle of the ALD technique in accordance with the present invention includes flowing the purge gas, $N_2$, into the processing chamber 37 during time $t_1$, which is approximately five seconds before $B_2H_6$ is flowed into the processing chamber 37. During time $t_2$, the processing gas $B_2H_6$ is flowed into the processing chamber 37 for approximately five seconds, along with a carrier gas, which in this example is $N_2$. After five seconds have lapsed, the flow of $B_2H_6$ terminates and the flow of $N_2$ continues during time $t_3$ for an additional five seconds, purging the processing chamber of $B_2H_6$. During time $t_4$, the processing chamber 37 is pumped so as to remove all gases. The pumping process lasts approximately thirty seconds. After pumping of the process chamber 37, the carrier gas Ar is introduced for approximately five seconds during time $t_5$, after which time the process gas $WF_6$ is introduced into the processing chamber 37 for about five seconds, along with the carrier gas Ar during time $t_6$. The flow of the processing gas $WF_6$ into the processing chamber 37 is terminated approximately five seconds after it commenced. After the flow of $WF_6$ into the processing chamber 37 terminates, the flow of Ar continues for five additional seconds, during time $t_7$. Thereafter, the processing chamber 37 is pumped so as to remove all gases therein, during time $t_8$. As before, the pumping process lasts approximately thirty seconds, thereby concluding one cycle of the ALD technique in accordance with the present invention.

The benefits of employing ALD are manifold, including flux-independence of layer formation that provides uniformity of deposition independent of the size of a substrate. For example, the measured difference of the layer uniformity and thickness measured between of 200 mm substrate and a 32 mm substrate deposited in the same chamber is negligible. This is due to the self-limiting characteristics of chemisorption. Further, the chemisorption characteristics contribute to near-perfect step coverage over complex topography.

Figure 4:
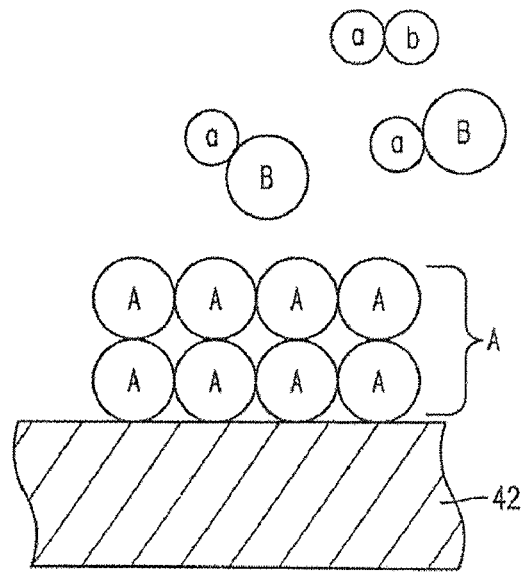
FIG. 4 is a schematic view showing deposition of second molecule onto a substrate during ALD to form a refractory metal layer.
Figure 6:
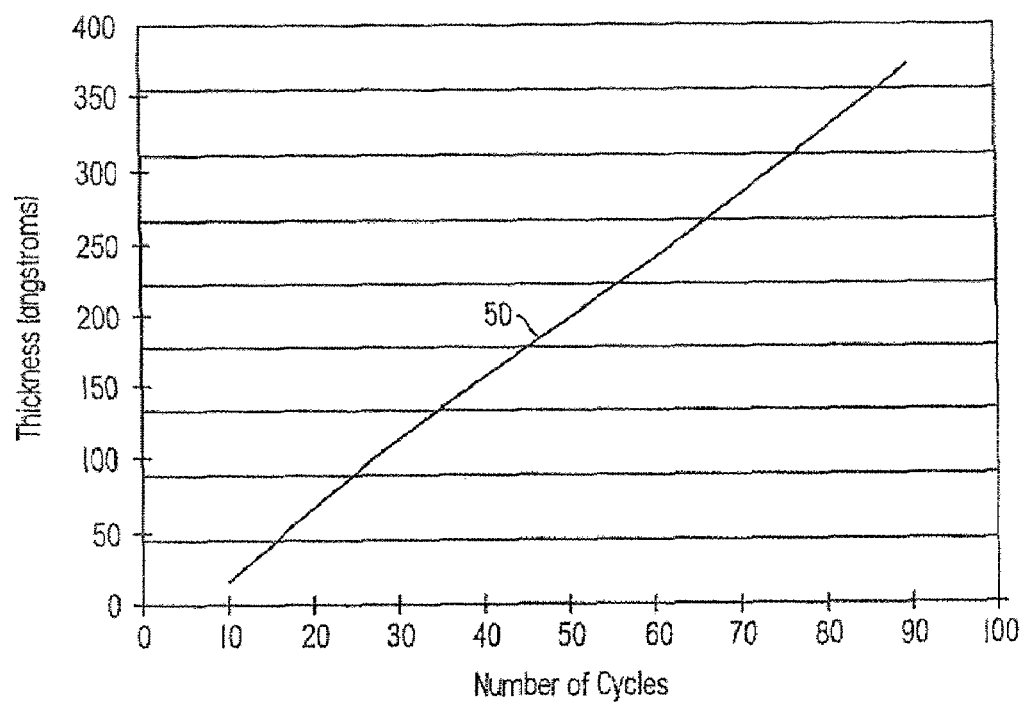
FIG. 6 is a graphical representation showing the relationship between the number of ALD cycles and the thickness of a layer formed on a substrate employing ALD, in accordance with the present invention.
Figure 7:
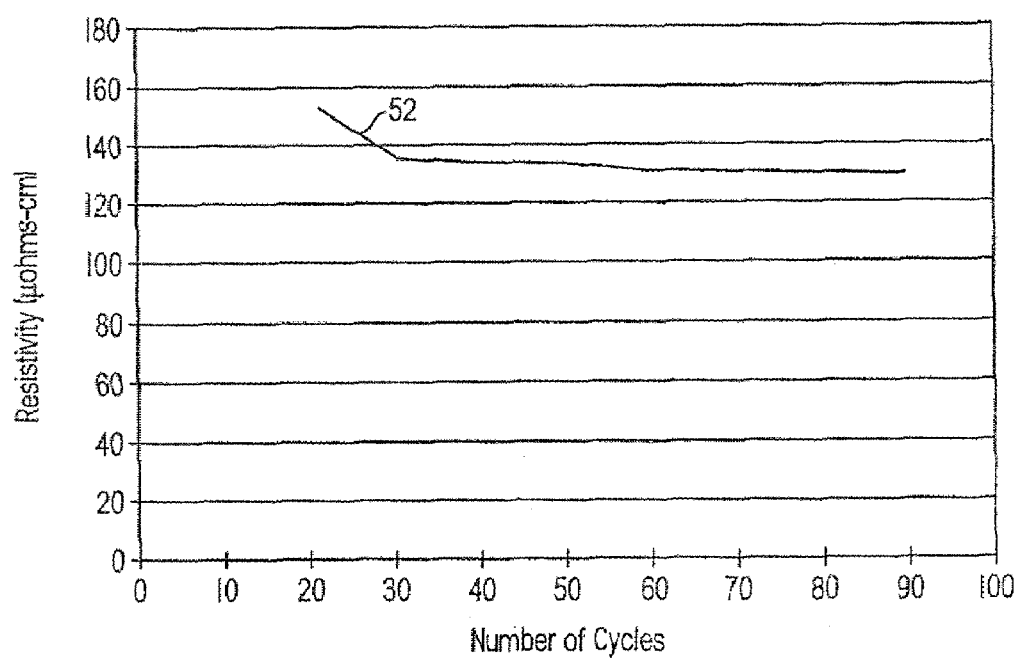
FIG. 7 is a graphical representation showing the relationship between the number of ALD cycles and the resistivity of a layer formed on a substrate employing ALD, in accordance with the present invention.

In addition, the thickness of the layer A, shown in FIG. 4, may be easily controlled while minimizing the resistance of the same by employing ALD. With reference to FIG. 6 it is seen the slope of line 50 that the thickness of the tungsten layer A is proportional to the number of cycles employed to form the same. The resistivity of the tungsten layer, however, is relatively independent of the thickness of the layer, as shown by the slope of line 52 in FIG. 7. Thus, employing ALD, the thickness of a refractory metal layer may be easily controlled as a function of the cycling of the process gases introduced into the processing chamber with a negligible effect on the resistivity.

Figure 8:
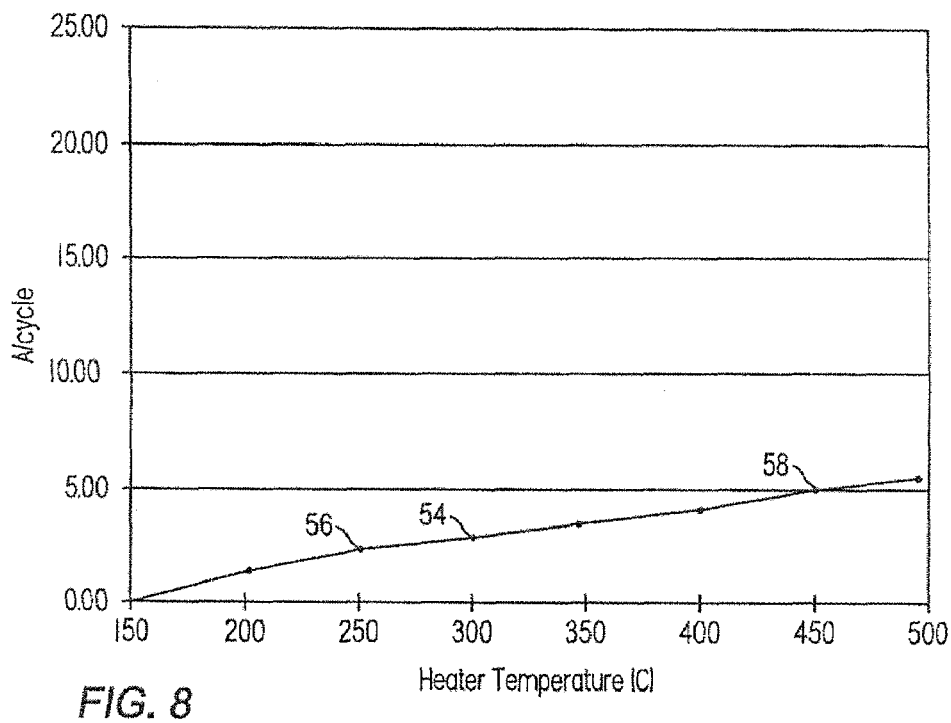
FIG. 8 is a graphical representation showing the relationship between the deposition rate of a layer formed on a substrate employing ALD and the temperature of the substrate.
Figure 9:
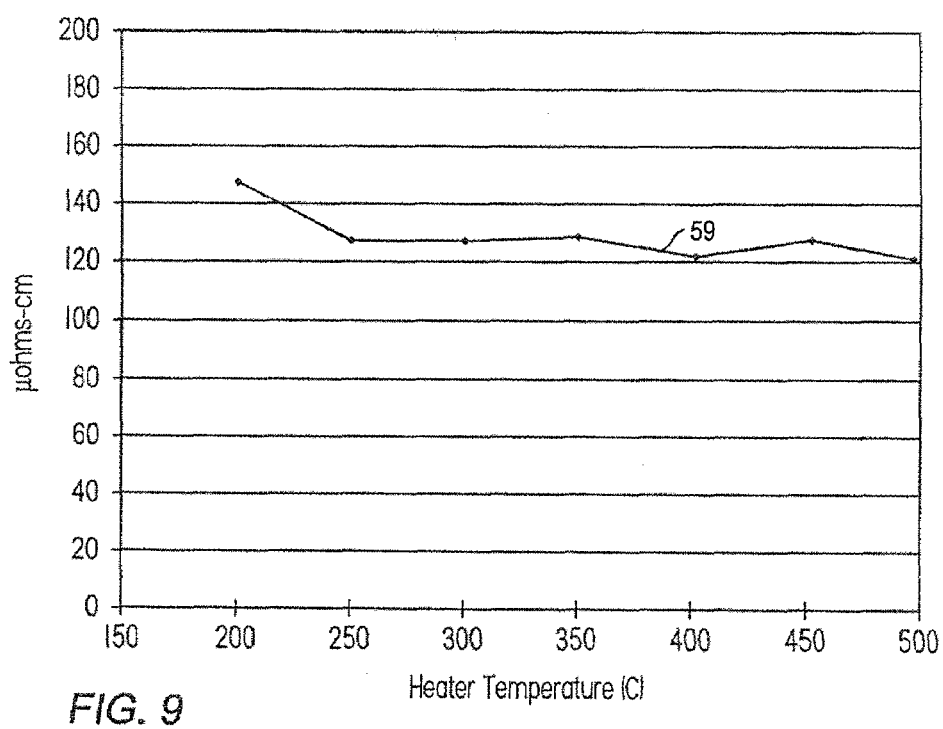
FIG. 9 is a graphical representation showing the relationship between the resistivity of a layer formed on a substrate employing ALD and the temperature of the substrate, in accordance with the present invention.

Referring to FIG. 8, control of the deposition rate was found to be dependent upon the temperature of the substrate 42. As shown by the slope of line 54, increasing the temperature of the substrate 42 increased the deposition rate of the tungsten layer A. For example, at point 56, the deposition rate is shown to be approximately 2 Å/cycle at 250° C. However at point 58 the deposition rate is approximately 5 Å/cycle at a temperature of 450° C. The resistivity of the tungsten layer, however, is virtually independent of the layer thickness, as shown by the slope of curve 59, shown in FIG. 9. As a result, the deposition rate of the tungsten layer may be controlled as a function of temperature without comprising the resistivity of the same. However, it is preferred to perform many processing steps at temperatures well below 450° C.

Figure 10:
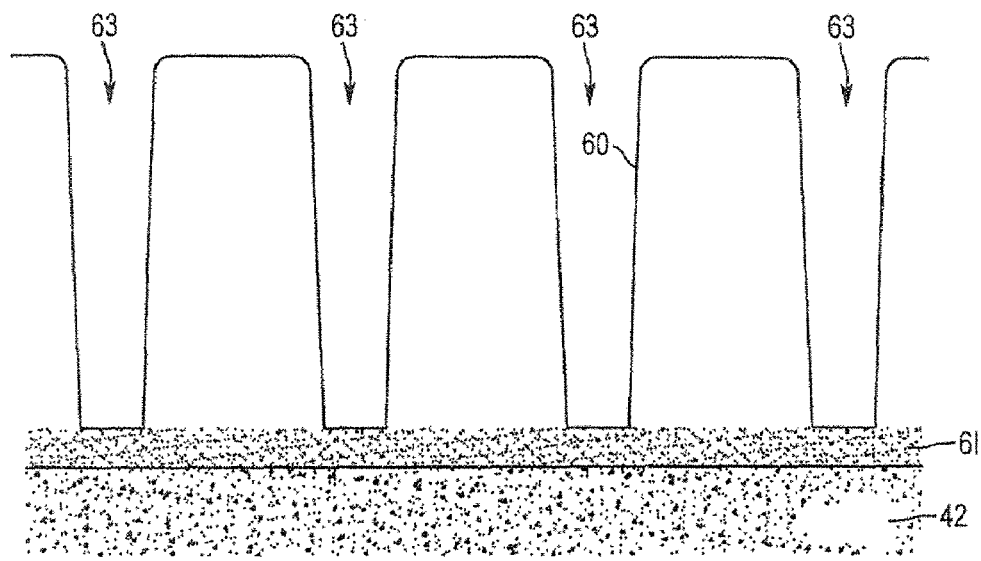
FIG. 10 is a cross-sectional view of a patterned substrate having a nucleation layer formed thereon employing ALD, in accordance with the present invention.
Figure 11:
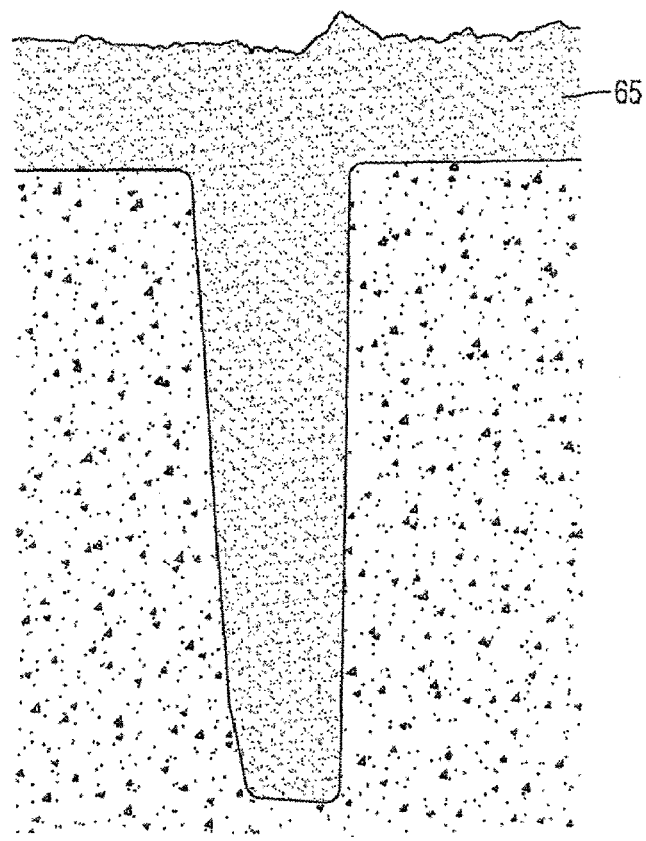
FIG. 11 is a partial cross-sectional view of the substrate, shown above in FIG. 10, with a refractory metal layer formed atop of the nucleation layer employing CVD, in accordance with the present invention.

To that end, a bifurcated deposition process may be practiced in which nucleation of the refractory metal layer occurs in a different chamber than the formation of the remaining portion of the refractory metal layer. Specifically, in the present example, nucleation of a tungsten layer occurs in chamber 12 employing the ALD techniques discussed above, with the substrate 42 being heated in the range of 200° C. to 400° C., and the processing chamber 37 being pressurized in the range of 1 to 10 Torr. A nucleation layer 60 of approximately 12 to 20 nm is formed on a patterned substrate 42, shown in FIG. 10. As shown, the substrate 42 includes a barrier layer 61 and a patterned layer having a plurality of vias 63. The nucleation layer is formed adjacent to the patterned layer covering the vias 63. As shown, forming the nucleation layer 60 employing ALD techniques provides 100% step coverage. To decrease the time required to form a complete layer of tungsten, a bulk deposition of tungsten onto the nucleation layer 60 occurs using CVD techniques, while the substrate 42 is disposed in processing chamber 14, shown in FIG. 1. The bulk deposition may be performed using recipes well known in the art. In this manner, a tungsten layer 65 providing a complete plug fill is achieved on the patterned layer with vias having aspect ratios of approximately 6:1, shown in FIG. 11.

Figure 12:
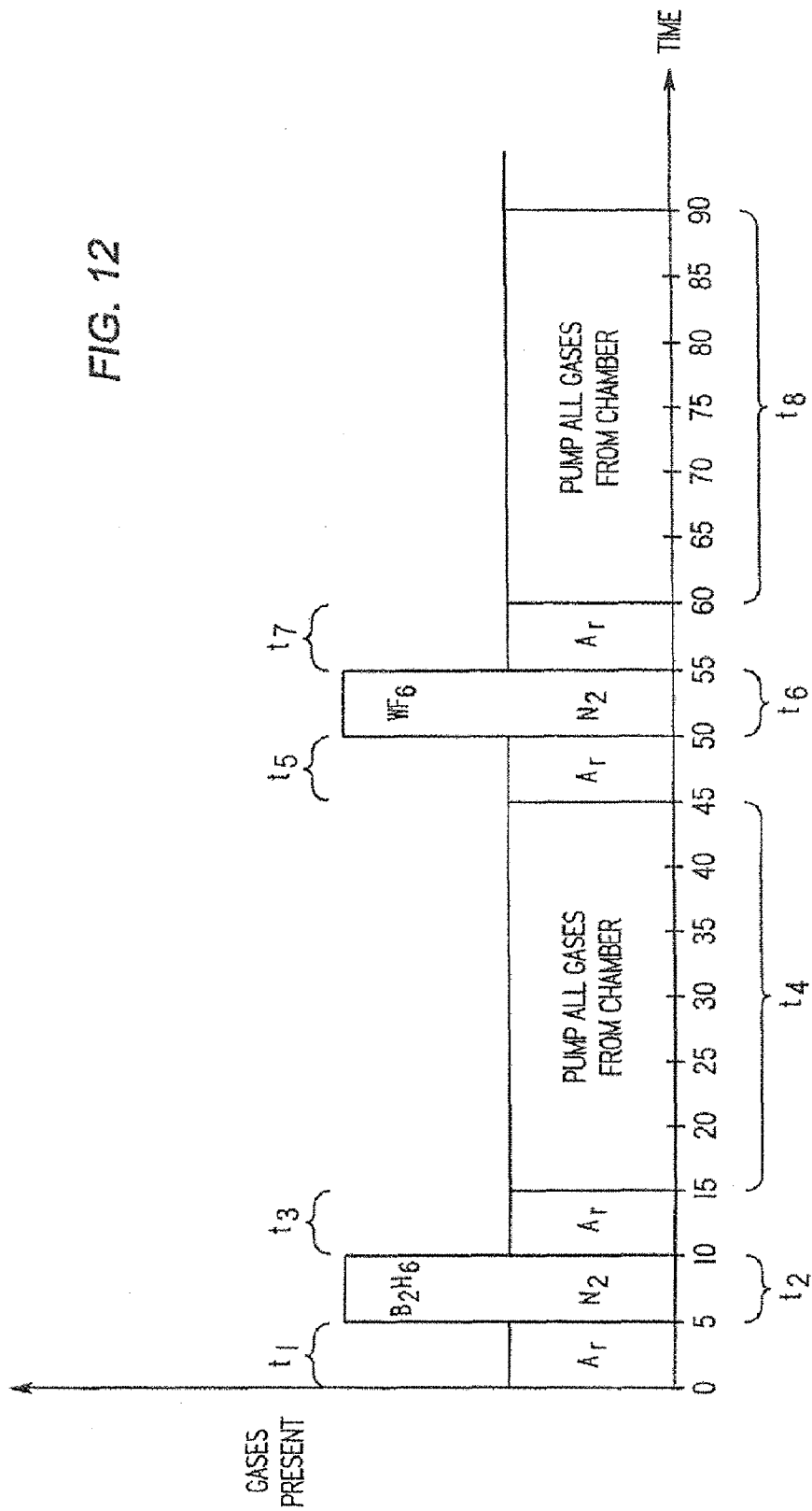
FIG. 12 is a graphical representation showing the concentration of gases shown above in FIG. 5 in accordance with a first alternate embodiment of the present invention.
Figure 13:
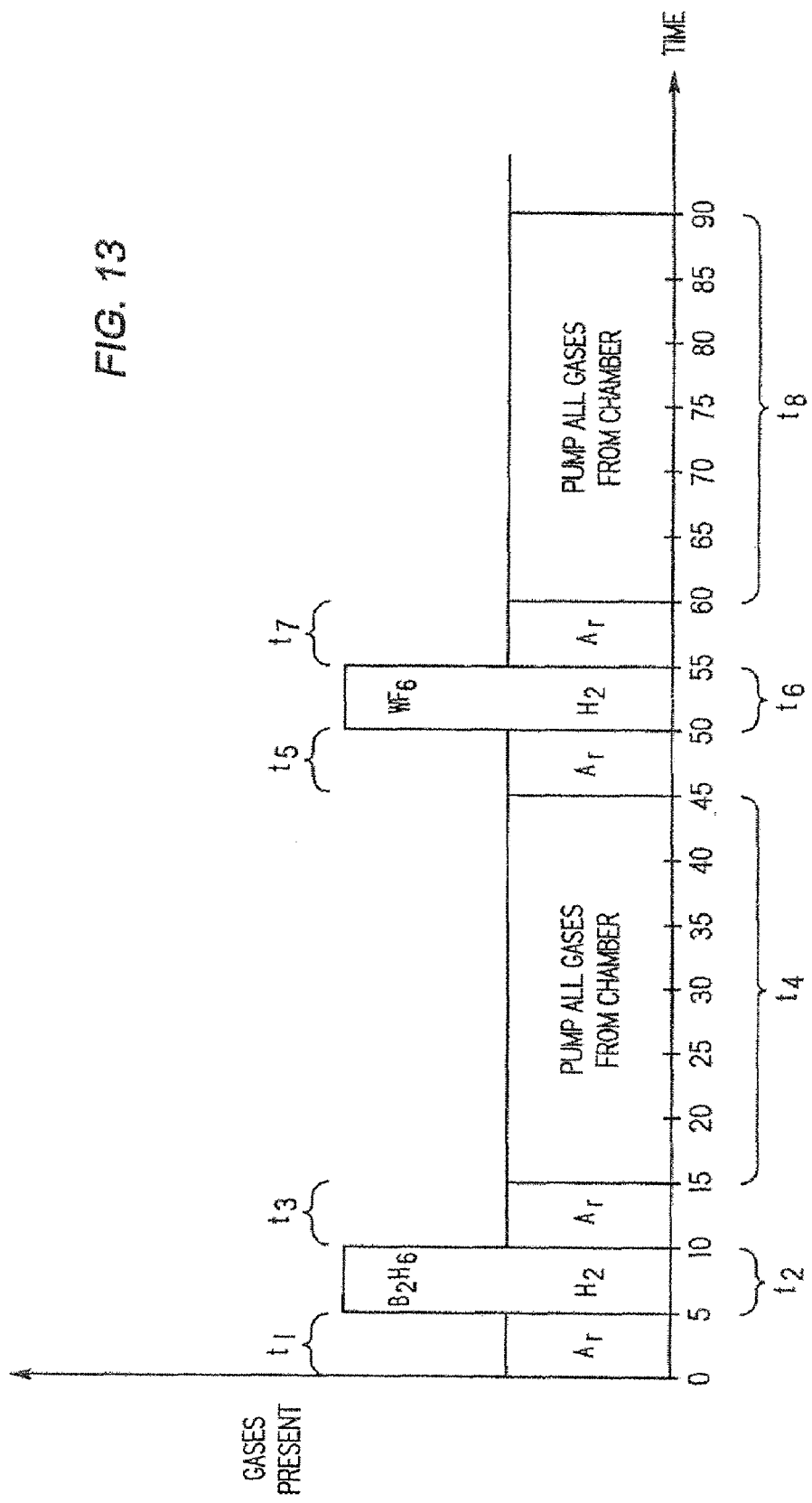
FIG. 13 is a graphical representation showing the concentration of gases shown above in FIG. 5 in accordance with a second alternate embodiment of the present invention.

As mentioned above, in an alternate embodiment of the present invention, the carrier gas may differ from the purge gas, as shown in FIG. 12. The purge gas, which is introduced at time intervals $t_1$, $t_3$, $t_5$ and $t_7$ comprises of Ar. The carrier gas, which is introduced at time intervals $t_2$ and $t_6$, comprises of $N_2$. Thus, at time interval $t_2$ the gases introduced into the processing chamber include a mixture of $B_2H_6$ and $N_2$, and a time interval $t_6$, the gas mixture includes $WF_6$ and $N_2$. The pump process during time intervals $t_4$ and $t_8$ is identical to the pump process discussed above with respect to FIG. 5. In yet another embodiment, shown in FIG. 13, the carrier gas during time intervals $t_2$ and $t_6$ comprises $H_2$, with the purge gas introduced at time intervals $t_1$, $t_3$, $t_5$ and $t_7$ comprising of Ar. The pump processes at time intervals $t_4$ and $t_8$ are as discussed above. As a result, at time interval $t_2$ the gas mixture introduced into the processing chamber 37 consists of $B_2H_6$ and $H_2$, and $WF_6$ and $H_2$, at time interval $t_6$.

Figure 14:
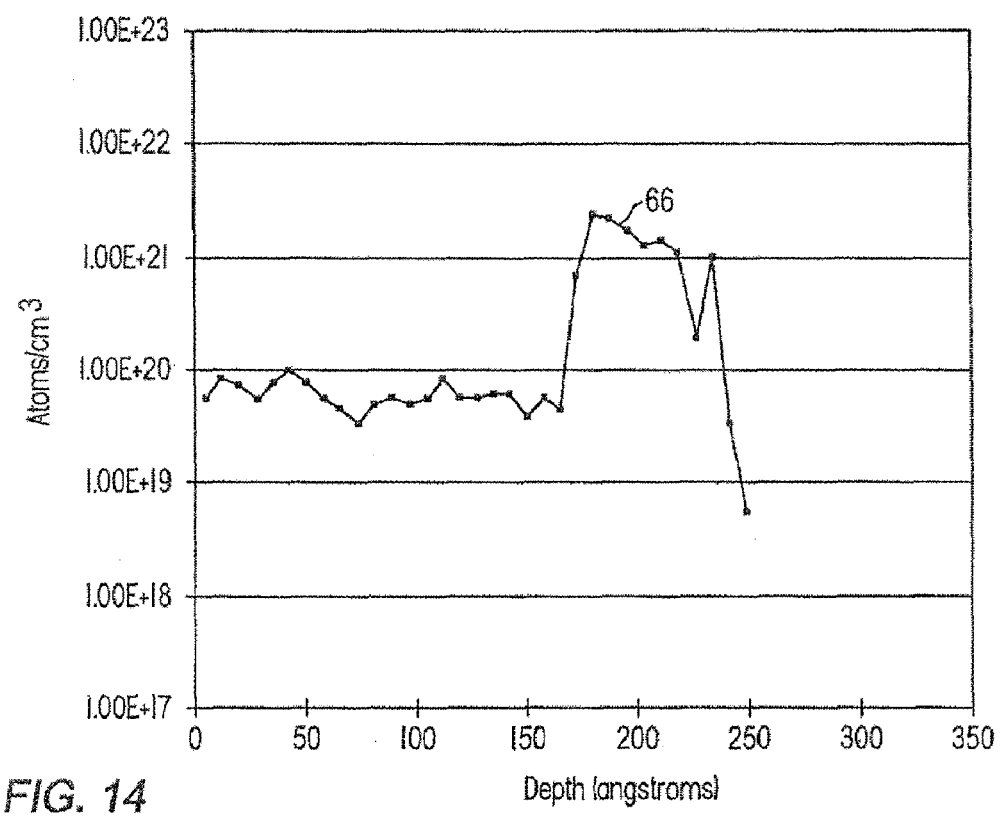
FIG. 14 is a graphical representation showing the fluorine content versus depth of a refractory metal layer formed on a substrate employing ALD either Ar or N₂ being a carrier gas.
Figure 15:
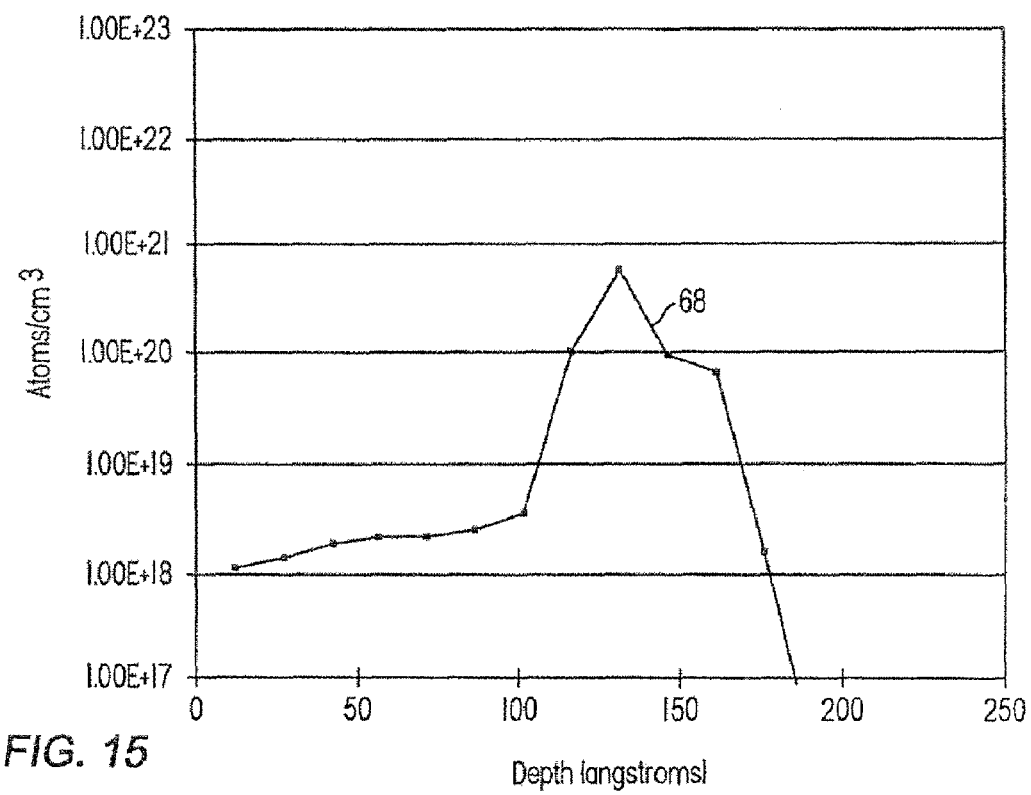
FIG. 15 is a graphical representation showing the fluorine content versus depth of a refractory metal layer formed on a substrate employing ALD with H₂ being a carrier gas.

An advantage realized by employing the $H_2$ carrier gas is that the stability of the tungsten layer A may be improved. Specifically, by comparing curve 66 in FIG. 14 with the curve 68 in FIG. 15, it is seen that the concentration of fluorine in the nucleation layer 60 is much less when $H_2$ is employed as the carrier gas, as compared with use of $N_2$ or Ar as a carrier gas. Specifically, the apex and nadir of curve 66 show that the fluorine concentration reaches levels in excess of $1 \times 10^{21}$ atoms per cubic centimeter and only as low as just below $1 \times 10^{19}$ atoms per cubic centimeter. Curve 68, however, shows that the fluorine concentration is well below $1 \times 10^{21}$ atoms per cubic centimeter at the apex and well below $1 \times 10^{17}$ atoms per cubic centimeter at the nadir. Thus, employing $H_2$ as the carrier gas provides a much more stable film, i.e., the probability of fluorine diffusing into the substrate, or adjacent layer is reduced. This also reduces the resistance of the refractory metal layer by avoiding the formation of a metal fluoride that may result from the increased fluorine concentration. Thus, the stability of the nucleation layer, as well as the resistivity of the same, may be controlled as a function of the carrier gas employed. This is also true when a refractory metal layer is deposited entirely employing ALD techniques, i.e., without using other deposition techniques, such as CVD.

Referring again to FIG. 2, the process for depositing the tungsten layer may be controlled using a computer program product that is executed by the controller 22. To that end, the controller 22 includes a central processing unit (CPU) 70, a volatile memory, such as a random access memory (RAM) 72 and permanent storage media, such as a floppy disk drive for use with a floppy diskette, or hard disk drive 74. The computer program code can be written in any conventional computer readable programming language; for example, 68000 assembly language, C, C++, Pascal, FORTRAN, and the like. Suitable program code is entered into a single file, or multiple files, using a conventional text editor and stored or embodied in a computer-readable medium, such as the hard disk drive 74. If the entered code text is in a high level language, the code is compiled and the resultant compiler code is then linked with an object code of precompiled Windows® library routines. To execute the linked and compiled object code the system user invokes the object code, causing the CPU 70 to load the code in RAM 72. The CPU 70 then reads and executes the code to perform the tasks identified in the program.

Although the invention has been described in terms of specific embodiments, one skilled in the art will recognize that various changes to the reaction conditions, i.e., temperature, pressure, film thickness and the like can be substituted and are meant to be included herein. In addition, other refractory metals may be deposited, in addition to tungsten, and other deposition techniques may be employed in lieu of CVD. For example, physical vapor deposition (PVD) techniques, or a combination of both CVD and PVD techniques may be employed. Therefore, the scope of the invention should not be based upon the foregoing description. Rather, the scope of the invention should be determined based upon the claims recited herein, including the full scope of equivalents thereof.

What is claimed is:

1. A method for forming a tungsten material on a substrate surface, comprising:
   positioning a substrate within a deposition chamber;
   heating the substrate to a deposition temperature;
   exposing the substrate sequentially to a first reducing gas and a tungsten precursor gas to form a tungsten nucleation layer on the substrate during an atomic layer deposition process; and
   exposing the substrate to a deposition gas comprising a second reducing gas and the tungsten precursor gas to form a tungsten bulk layer on the tungsten nucleation layer during a chemical vapor deposition process.

2. The method of claim 1, further comprising exposing the substrate to an initiation gas prior to the atomic layer deposition process.

3. The method of claim 2, wherein the initiation gas comprises nitrogen or argon.

4. The method of claim 3, wherein the substrate is exposed to the initiation gas for about 5 seconds.

5. The method of claim 2, wherein the first reducing gas comprises a gas selected from the group consisting of diborane, hydrogen, silane, derivatives thereof, and combinations thereof.

6. The method of claim 1, wherein the first reducing gas comprises diborane and hydrogen.

7. The method of claim 6, wherein the tungsten precursor gas comprises tungsten hexafluoride.

8. The method of claim 1, wherein the first reducing gas comprises silane and hydrogen.

9. The method of claim 8, wherein the tungsten precursor gas comprises tungsten hexafluoride.

10. The method of claim 1, wherein the tungsten nucleation layer is formed having a thickness within a range from about 10 Å to about 100 Å.

11. The method of claim 1, wherein the tungsten nucleation layer is deposited on a barrier layer disposed on the substrate, wherein the barrier layer comprises a material selected from the group consisting of titanium, titanium nitride, and combinations thereof.

12. The method of claim 1, wherein the deposition chamber is a single station within a deposition system.

13. The method of claim 1, wherein the deposition chamber is a first deposition station within a deposition system containing multiple stations surrounded by a wall.

14. The method of claim 13, further comprising positioning the substrate into a second deposition station subsequent the atomic layer deposition process and prior to the chemical vapor deposition process, and forming the tungsten bulk layer within the second deposition station.

15. The method of claim 14, wherein the second reducing gas comprises silane.

16. The method of claim 13, further comprising:
   positioning the substrate comprising the tungsten nucleation layer into a second deposition station within the deposition system; and
   forming the tungsten bulk layer on the tungsten nucleation layer by the chemical vapor deposition process layer within the second deposition station.

17. The method of claim 1, wherein the pressure of the process chamber during the atomic layer deposition process is within a range from about 1 Torr to about 10 Torr.

18. The method of claim 1, wherein the deposition temperature is within a range from about 200° C. to about 400° C.

19. A method for forming a tungsten material on a substrate surface, comprising:
   positioning a substrate having a plurality of vias within a deposition chamber;
   exposing the substrate to a reducing gas to form an adsorbed reducing gas layer;
   purging the reducing gas from the deposition chamber;
   exposing the substrate sequentially to a tungsten precursor gas and the reducing gas to form a tungsten nucleation layer within the vias; and
   depositing a tungsten bulk layer over the tungsten nucleation layer to fill the vias during a during a chemical vapor deposition process.

20. A method for forming a tungsten material on a substrate surface, comprising:
- positioning a substrate at a first deposition station within a deposition system comprising at least two deposition stations
- flowing a reducing gas into the first deposition station, whereby the reducing gas is adsorbed onto the substrate to form an adsorbed reducing gas layer;
- purging the reducing gas from the first deposition station;
- exposing the substrate sequentially to a tungsten precursor gas and the reducing gas to form a tungsten nucleation layer thereon during an atomic layer deposition process;
- positioning the substrate at a second deposition station within the deposition system; and
- exposing the substrate to the tungsten precursor gas and a second reducing gas to deposit a tungsten bulk layer on the tungsten nucleation layer by a chemical vapor deposition process.

21. The method of claim 20, further comprising exposing the substrate to an initiation gas prior to the atomic layer deposition process.

22. The method of claim 21, wherein the initiation gas comprises nitrogen or argon.

23. The method of claim 22, wherein the substrate is exposed to the initiation gas for about 5 seconds.

24. The method of claim 21, wherein the first reducing gas comprises a gas selected from the group consisting of diborane, hydrogen, silane, derivatives thereof, and combinations thereof.

25. The method of claim 20, wherein the first reducing gas comprises diborane and hydrogen.

26. The method of claim 25, wherein the tungsten precursor gas comprises tungsten hexafluoride.

27. The method of claim 20, wherein the tungsten nucleation layer is formed having a thickness within a range from about 10 Å to about 100 Å.

28. The method of claim 20, wherein the tungsten nucleation layer is deposited on a barrier layer disposed on the substrate, wherein the barrier layer comprises a material selected from the group consisting of titanium, titanium nitride, and combinations thereof.

29. The method of claim 28, wherein the second reducing gas comprises silane.

30. The method of claim 20, wherein the first deposition station has a pressure within a range from about 1 Torr to about 10 Torr during the atomic layer deposition process.

31. The method of claim 20, wherein the substrate is heated to a temperature within a range from about 200° C. to about 400° C. during the atomic layer deposition process.

32. The method of claim 19, wherein the reducing gas comprises diborane and hydrogen.

33. The method of claim 32, wherein the substrate is exposed to a deposition gas comprising tungsten hexafluoride and hydrogen while depositing the tungsten bulk layer during the chemical vapor deposition process.

34. The method of claim 19, further comprising exposing the substrate to an initiation gas prior to the atomic layer deposition process.

35. The method of claim 34, wherein the initiation gas comprises nitrogen or argon.

36. The method of claim 35, wherein the substrate is exposed to the initiation gas for about 5 seconds.

37. The method of claim 1, wherein the deposition gas comprises tungsten hexafluoride and hydrogen during the chemical vapor deposition process.

38. The method of claim 16, wherein the deposition gas comprises tungsten hexafluoride and hydrogen during the chemical vapor deposition process.

39. The method of claim 20, wherein the substrate is exposed to a deposition gas comprising tungsten hexafluoride and hydrogen while depositing the tungsten bulk layer during the chemical vapor deposition process.

* * * * *

UNITED STATES PATENT AND TRADEMARK OFFICE
CERTIFICATE OF CORRECTION

| | | |
|---|---|---|
| PATENT NO. | : 7,235,486 B2 | Page 1 of 2 |
| APPLICATION NO. | : 11/468156 | |
| DATED | : June 26, 2007 | |
| INVENTOR(S) | : Kori et al. | |

It is certified that error appears in the above-identified patent and that said Letters Patent is hereby corrected as shown below:

Title Page; item (56); Page 2; Col. 1;
U.S. PATENT DOCUMENTS:

Please delete "5,503,876 A 4/1996 Fields et al." and insert --5,503,875 A 4/1996 Imai, et al.--.

Title Page; item (56); Page 4; Col. 2;
FOREIGN PATENT DOCUMENTS:

Please delete "03-022589" and insert --03-022569--.

Title Page; item (56); Page 5-6, Col. 2;
OTHER PUBLICATIONS:

Choe, et al. reference, please delete "Choe, et al." and insert --Choi, et al.--;

Yang, et al. reference, please delete "$WF_8/B_2H_8$" and insert --$WF_6B_2H_6$--.

In the Specification:

In Column 3, Line 25, please delete "of second" and insert --of a second--;

In Column 3, Line 66, please delete "ALD" and insert --ALD,--;

In Column 4, Line 19, please delete "use of" and insert --using--;

In Column 4, Line 49, please delete "may used" and insert --may be used--;

In Column 5, Line 11, please delete "on the".

UNITED STATES PATENT AND TRADEMARK OFFICE
CERTIFICATE OF CORRECTION

PATENT NO.         : 7,235,486 B2
APPLICATION NO. : 11/468156
DATED              : June 26, 2007
INVENTOR(S)       : Kori et al.

It is certified that error appears in the above-identified patent and that said Letters Patent is hereby corrected as shown below:

In the Claims:

In Column 8, Claim 19, Line 66, please delete "during a during a" and insert --during a--.

Signed and Sealed this

Fourth Day of September, 2007

JON W. DUDAS
*Director of the United States Patent and Trademark Office*